United States Patent
Yeo et al.

(10) Patent No.: US 10,164,042 B2
(45) Date of Patent: Dec. 25, 2018

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Yee-Chia Yeo, Hsinchu (TW); Hung-Li Chiang, Taipei (TW); Jyh-Cherng Sheu, HsinChu (TW); Sung-Li Wang, Zhubei (TW); I-Sheng Chen, Taipei (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/418,995

(22) Filed: Jan. 30, 2017

(65) Prior Publication Data

US 2018/0151683 A1    May 31, 2018

Related U.S. Application Data

(60) Provisional application No. 62/427,597, filed on Nov. 29, 2016.

(51) Int. Cl.
*H01L 21/8234* (2006.01)
*H01L 29/45* (2006.01)
(Continued)

(52) U.S. Cl.
CPC ...... *H01L 29/45* (2013.01); *H01L 21/823425* (2013.01); *H01L 23/5226* (2013.01);
(Continued)

(58) Field of Classification Search
CPC ....... H01L 21/823814; H01L 29/41741; H01L 29/165; H01L 29/7827; H01L 29/41766;
(Continued)

(56) References Cited

U.S. PATENT DOCUMENTS 8,487,378 B2   7/2013  Goto et al.
8,703,556 B2   4/2014  Kelly et al.
(Continued)

FOREIGN PATENT DOCUMENTS

KR   10-2014-0095297 A   8/2014

OTHER PUBLICATIONS

Office Action issued in corresponding German Patent Application No. 10 2017 103 499.4, dated Aug. 21, 2017.

*Primary Examiner* — Caridad Everhart
(74) *Attorney, Agent, or Firm* — McDermott Will & Emery LLP

(57) ABSTRACT

A semiconductor device includes a field effect transistor (FET). The FET includes a first channel, a first source and a first drain; a second channel, a second source and a second drain; and a gate structure disposed over the first and second channels. The gate structure includes a gate dielectric layer and a gate electrode layer. The first source includes a first crystal semiconductor layer and the second source includes a second crystal semiconductor layer. The first source and the second source are connected by an alloy layer made of one or more Group IV element and one or more transition metal elements. The first crystal semiconductor layer is not in direct contact with the second crystal semiconductor layer.

20 Claims, 21 Drawing Sheets

(51) Int. Cl.
 *H01L 29/08* (2006.01)
 *H01L 29/417* (2006.01)
 *H01L 29/78* (2006.01)
 *H01L 23/522* (2006.01)
 *H01L 27/088* (2006.01)
 *H01L 27/092* (2006.01)

(52) U.S. Cl.
 CPC ...... *H01L 27/0886* (2013.01); *H01L 27/0924* (2013.01); *H01L 29/0847* (2013.01); *H01L 29/41791* (2013.01); *H01L 29/7851* (2013.01); *H01L 29/456* (2013.01); *H01L 2029/7858* (2013.01)

(58) Field of Classification Search
 CPC ............. H01L 29/161; H01L 21/28518; H01L 27/0924; H01L 27/0886; H01L 23/5226; H01L 29/7851; H01L 29/0847; H01L 29/456; H01L 29/41791
 See application file for complete search history.

(56) References Cited

U.S. PATENT DOCUMENTS

| | | | |
|---|---|---|---|
| 8,729,634 B2 | 5/2014 | Shen et al. | |
| 8,826,213 B1 | 9/2014 | Ho et al. | |
| 8,887,106 B2 | 11/2014 | Ho et al. | |
| 9,029,930 B2 | 5/2015 | Kelly et al. | |
| 9,166,010 B2 | 10/2015 | Kelly et al. | |
| 2007/0132009 A1* | 6/2007 | Takeuchi | H01L 21/845 257/321 |
| 2011/0210404 A1* | 9/2011 | Su | H01L 21/823431 257/401 |
| 2011/0298058 A1* | 12/2011 | Kawasaki | H01L 29/66795 257/401 |
| 2014/0203370 A1 | 7/2014 | Maeda et al. | |
| 2014/0282326 A1 | 9/2014 | Chen et al. | |
| 2015/0380489 A1* | 12/2015 | Chan | H01L 27/0886 257/192 |
| 2016/0020209 A1 | 1/2016 | Anderson et al. | |
| 2016/0111447 A1 | 4/2016 | Bryant et al. | |
| 2017/0018464 A1* | 1/2017 | Kim | H01L 21/823871 |

* cited by examiner

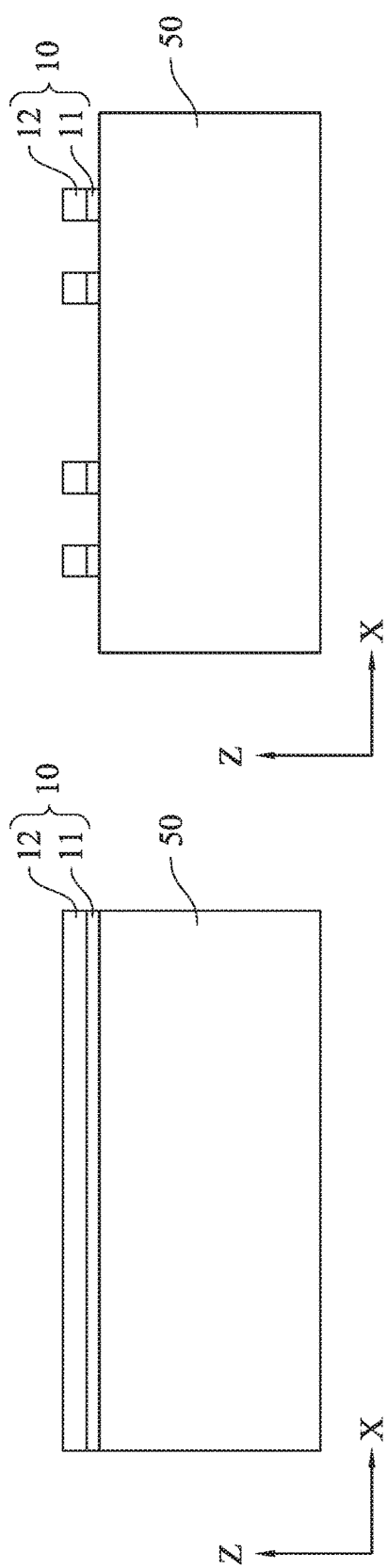
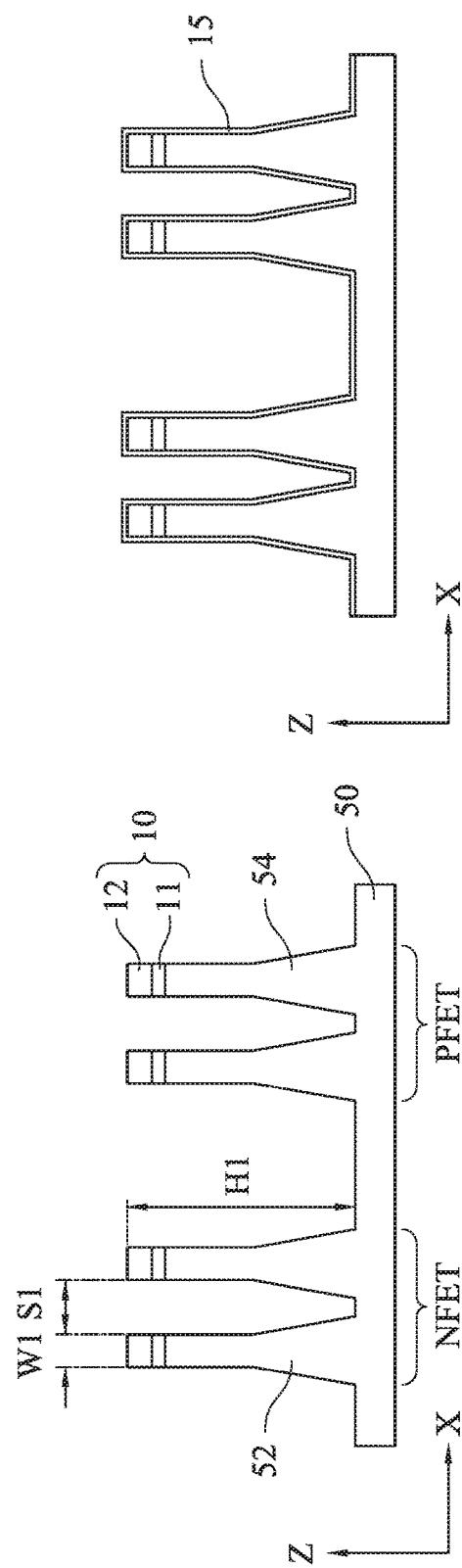

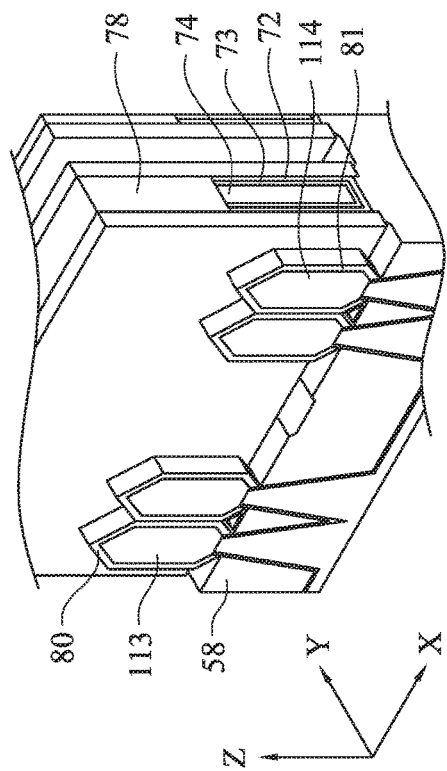
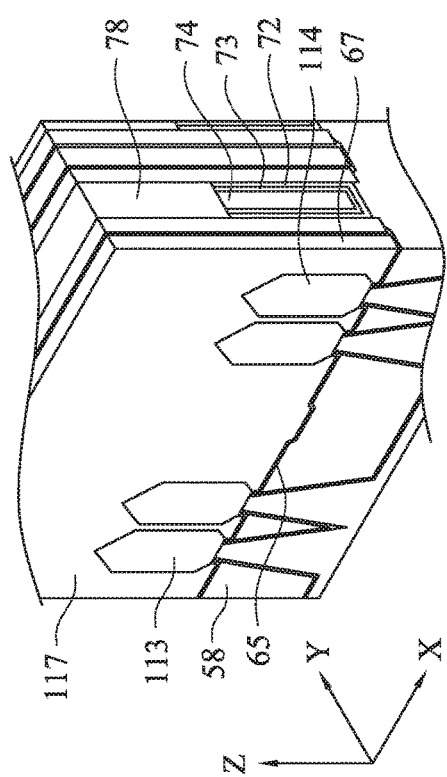
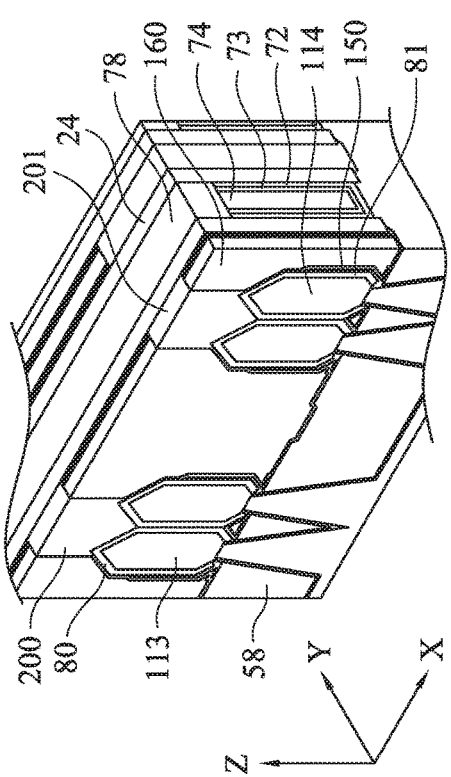
FIG. 6A
FIG. 6B
FIG. 6C

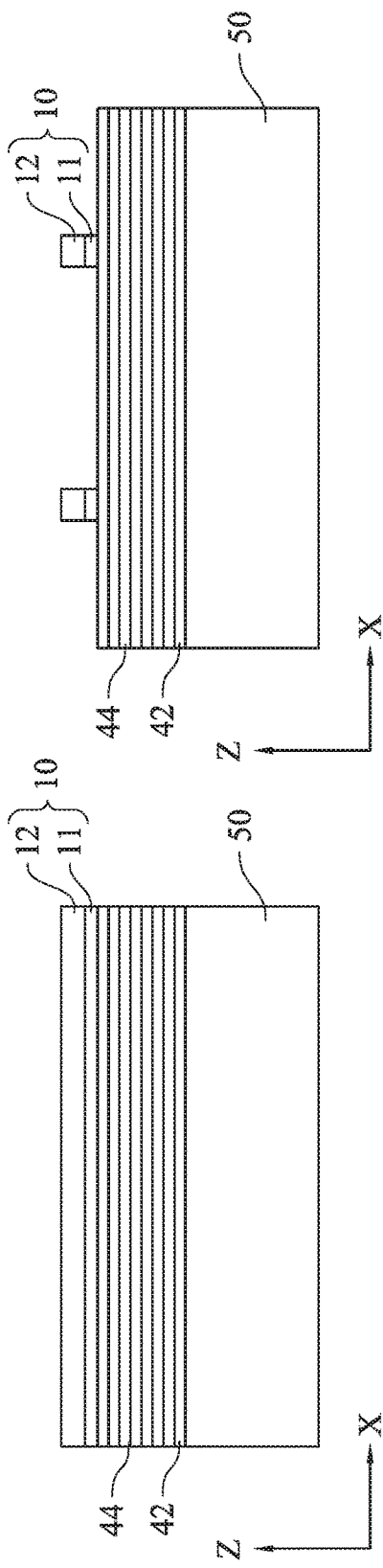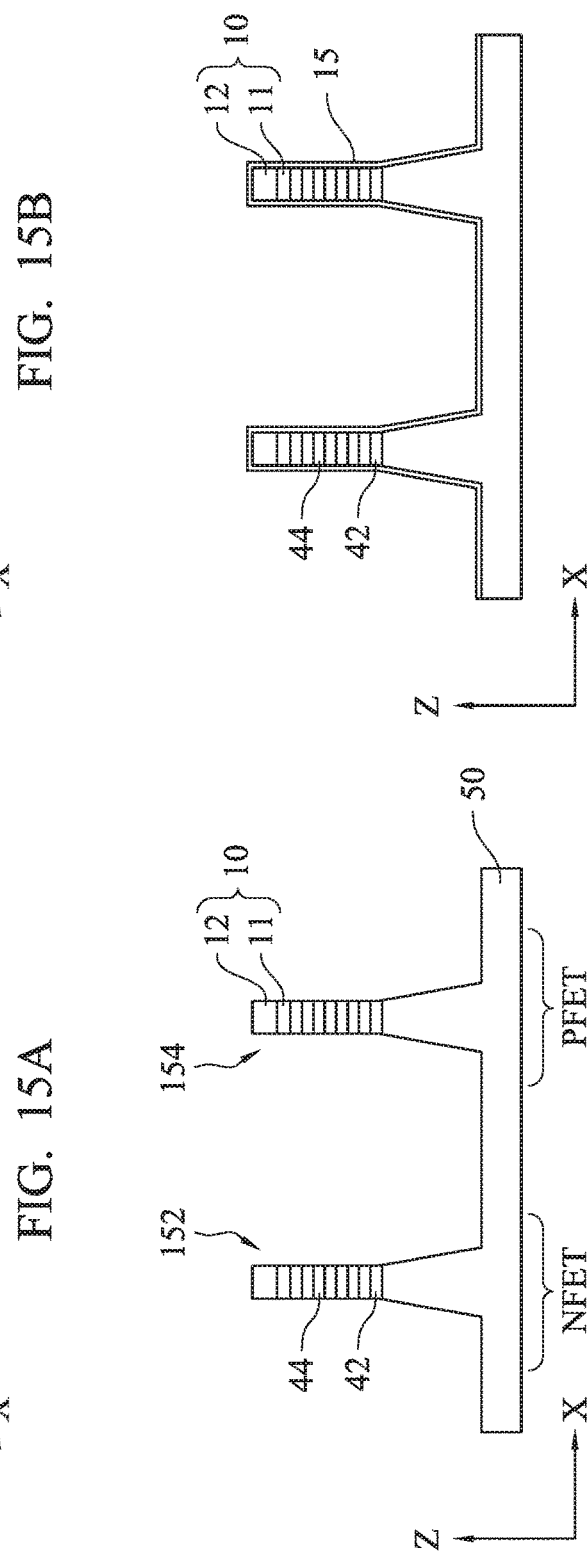

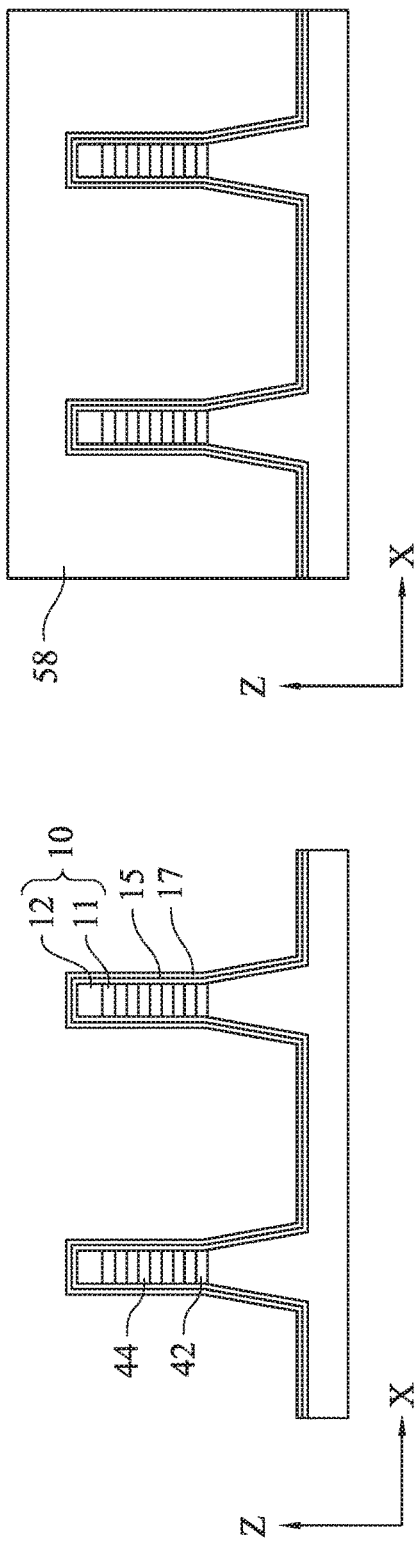
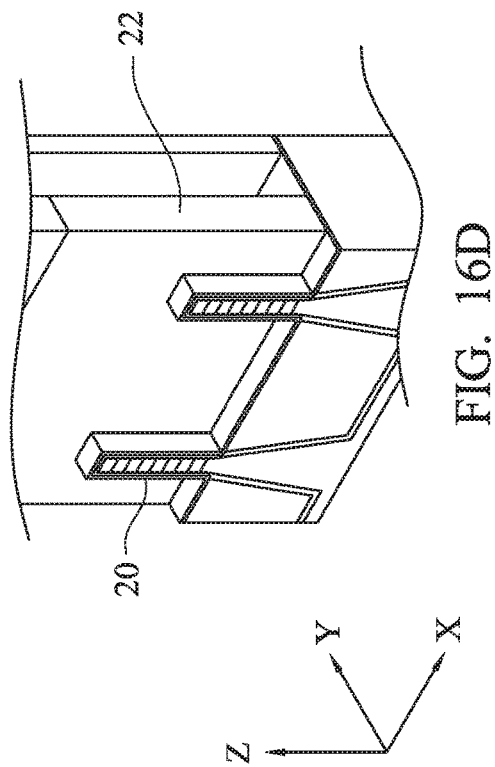
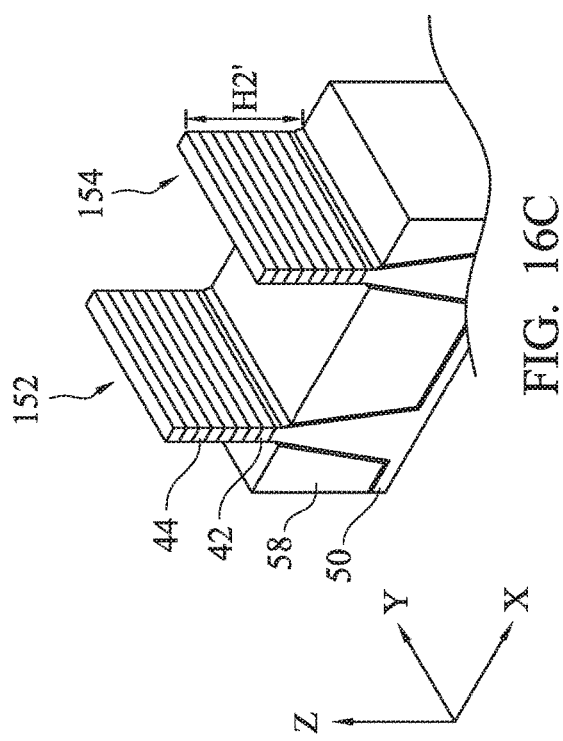
FIG. 16A
FIG. 16B
FIG. 16C
FIG. 16D

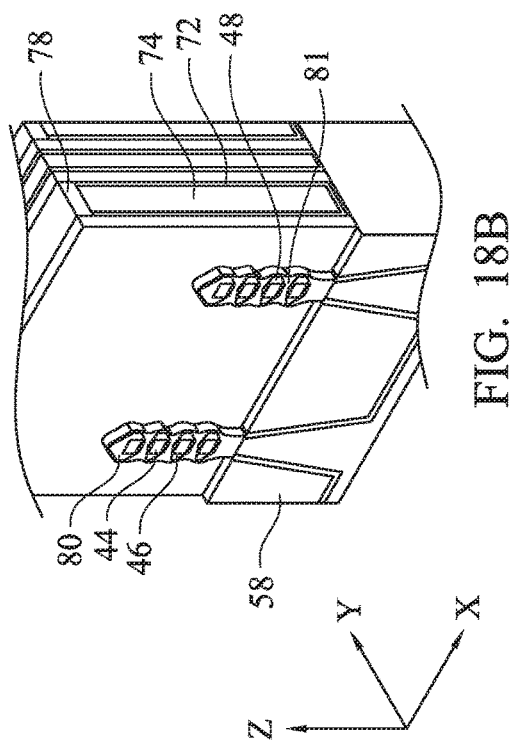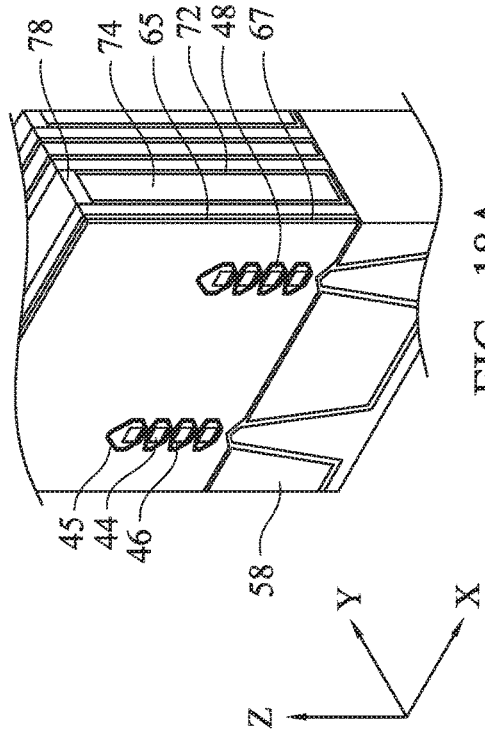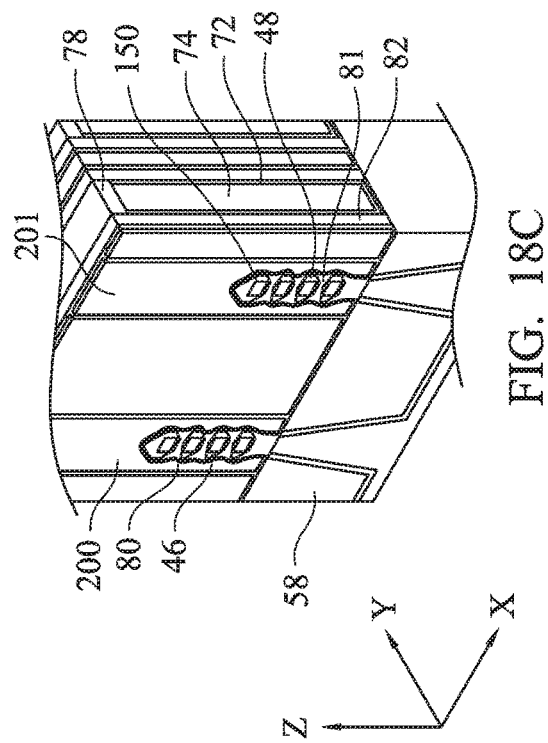

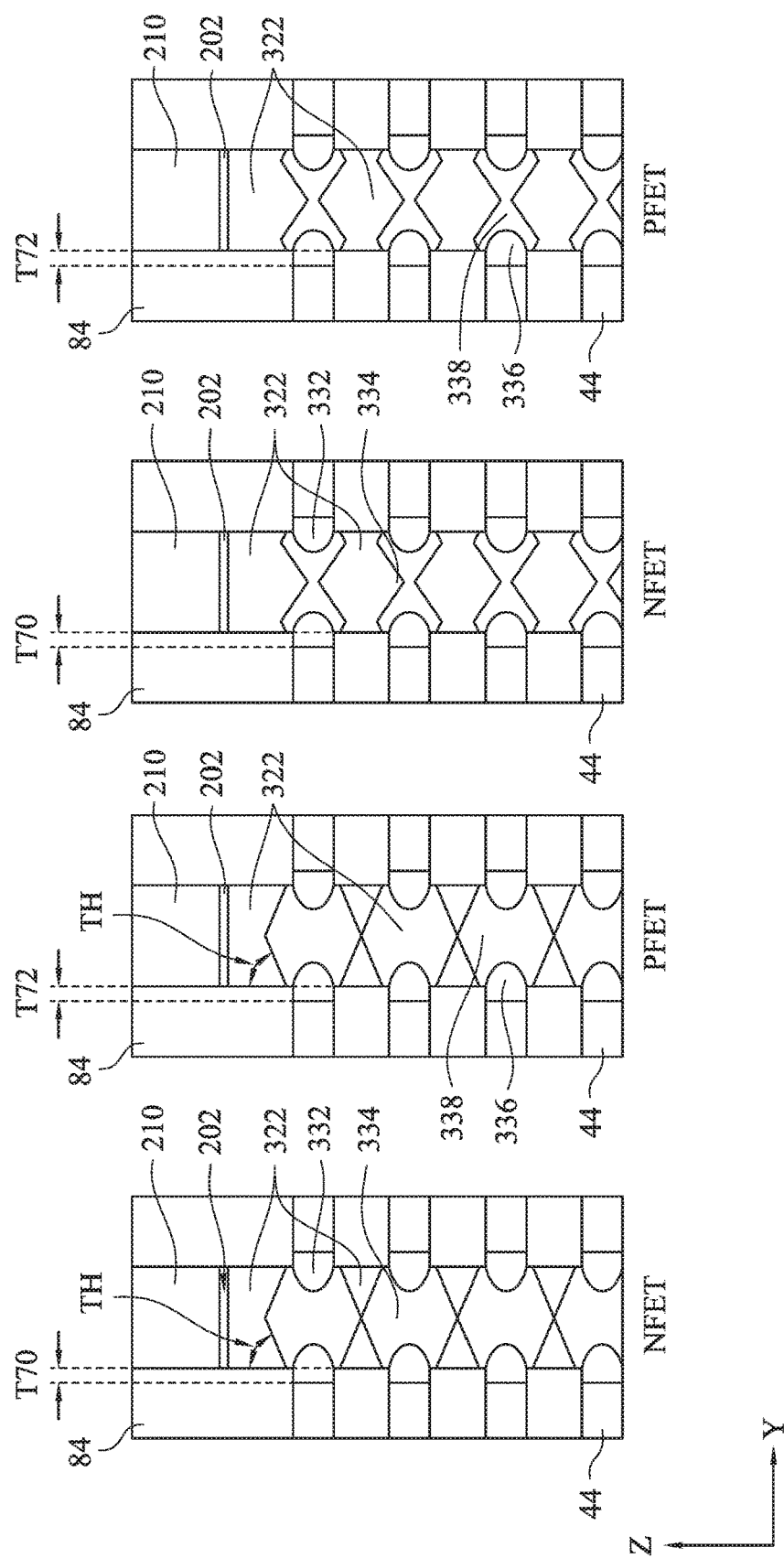

US 10,164,042 B2

SEMICONDUCTOR DEVICE AND MANUFACTURING METHOD THEREOF

CROSS-REFERENCE TO RELATED APPLICATIONS

This application claims priority to U.S. Provisional Patent Application 62/427,597 filed Nov. 29, 2016, the entire disclosure of which is incorporated herein by reference.

TECHNICAL FIELD

The disclosure relates to semiconductor devices, such as integrated circuits, and more particularly to semiconductor devices having silicide layers formed on source/drain (S/D) structures and their manufacturing processes.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed by using an epitaxial growth method. Source/drain contact plugs are also formed on the sources/drains, of which contact resistance should be low.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A-1D show exemplary cross sectional views of various stages for manufacturing a semiconductor device according to some embodiments of the present disclosure.

FIGS. 6A-6C show exemplary perspective views of various stages for manufacturing a semiconductor device according to another embodiment of the present disclosure.

FIGS. 15A-15D show exemplary cross sectional views of various stages for manufacturing a semiconductor device according to another embodiment of the present disclosure.

FIGS. 16A-16B show exemplary cross sectional views and FIGS. 16C-16D show exemplary perspective views of various stages for manufacturing a semiconductor device according to some embodiments of the present disclosure.

FIGS. 18A-18C show exemplary perspective views of various stages for manufacturing a semiconductor device according to another embodiment of the present disclosure.

FIGS. 21A and 21B are exemplary cross sectional views of source/drain structures of a gate-all-around field effect transistor (GAA FET) according to some embodiments of the present disclosure.

DETAILED DESCRIPTION

Figure 2A:
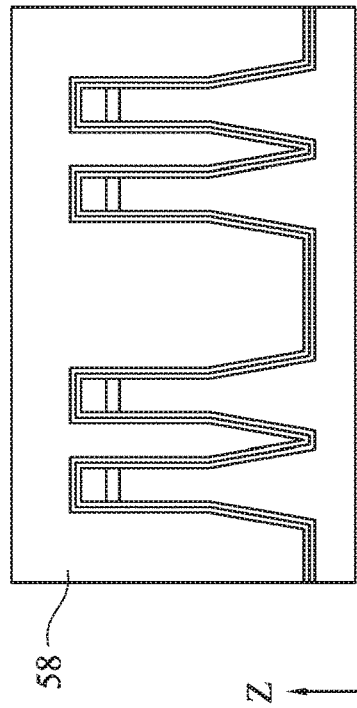
FIGS. 2A-2B show exemplary cross sectional views and FIGS. 2C-2D show exemplary perspective views of various stages for manufacturing a semiconductor device according to some embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

FIGS. 1A-4C show exemplary cross sectional views of various stages for manufacturing a FinFET according to some embodiments of the present disclosure. It is understood that additional operations can be provided before, during, and after processes shown by FIGS. 1A-4C, and some of the operations described below can be replaced or eliminated, for additional embodiments of the method. The order of the operations/processes may be interchangeable.

In the manufacturing method for a FinFET, fin structures are formed. A mask layer 10 is formed over a substrate 50, as shown in FIG. 1A. The mask layer 10 is formed by, for example, a thermal oxidation process and/or a chemical vapor deposition (CVD) process. The substrate 50 is, for example, a p-type silicon substrate with an impurity concentration in a range from about $1 \times 10^{15}$ cm$^{-3}$ to about $1 \times 10^{16}$ cm$^{-3}$. In other embodiments, the substrate is an n-type silicon or germanium substrate with an impurity concentration in a range from about $1 \times 10^{15}$ cm$^{-3}$ to about $1 \times 10^{16}$ cm$^{-3}$.

Alternatively, the substrate 50 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. The substrate 50 may include various regions that have been suitably doped with impurities (e.g., p-type or n-type conductivity).

The mask layer 10 includes, for example, a pad oxide (e.g., silicon oxide) layer 11 and a silicon nitride mask layer 12, as shown in FIG. 1A, in some embodiments.

The pad oxide layer 11 may be formed by using thermal oxidation or a CVD process. The silicon nitride mask layer 12 may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer 11 is in a range from about 2 nm to about 15 nm and the thickness of the silicon nitride mask layer 12 is in a range from about 2 nm to about 50 nm in some embodiments.

A mask pattern is further formed over the mask layer. The mask pattern is, for example, a resist pattern formed by lithography operations. By using the mask pattern as an etching mask, a hard mask pattern of the pad oxide layer 11 and the silicon nitride mask layer 12 is formed, as shown in FIG. 1B.

Then, as shown in FIG. 1C, by using the hard mask pattern as an etching mask, the substrate 50 is patterned into fin structures 52 for an n-type FET and fin structures 54 for a p-type FET by trench etching using a dry etching method and/or a wet etching method. The dimensions for the fin structures 52 for an n-type FET may be the same as or different from those for the fin structures 54 for a p-type FET.

In FIG. 1C, two fin structures 52 and two fin structures 54 are disposed over the substrate 50. However, the number of the fin structures is not limited to two. The numbers may be as small as one or more than three. In addition, one or more dummy fin structures may be disposed adjacent both sides of the fin structures 52 and/or the fin structures 54 to improve pattern fidelity in patterning processes.

The fin structures 52, 54 may be made of the same material as the substrate 50 and may continuously extend or protrude from the substrate 50. In this embodiment, the fin structures are made of Si. The silicon layers of the fin structures 52, 54 may be intrinsic, or appropriately doped with an n-type impurity or a p-type impurity.

The width W1 of the fin structures 52, 54 is in a range from about 5 nm to about 40 nm in some embodiments, and is in a range from about 7 nm to about 12 nm in other embodiments. The space Si between two fin structures is in a range from about 10 nm to about 40 nm in some embodiments. The height H1 (along the Z direction) of the fin structures 52, 54 is in a range from about 100 nm to about 300 nm in some embodiments, and is in a range from about 50 nm to 100 nm in other embodiments.

The lower part of the fin structures 52, 54 may be referred to as a well region, and the upper part of the fin structures 52, 54, which is covered by a gate electrode may be referred to as a channel or a channel region, and the upper part of the fin structures 52, 54, which is not covered by the gate electrode may be referred to as a source and a drain, or a source region and a drain region. In this disclosure, "source" and "drain" may be collectively referred to as "source/drain." The height of the well region is in a range from about 60 nm to 100 nm in some embodiments, and the height of the channel region is in a range from about 40 nm to 120 nm, and is in a range from about 38 nm to about 60 nm in other embodiments.

After the fin structures 52, 54 are formed, a first protective layer 15 is formed to cover the structures 52, 54, as shown in FIG. 1D. The first protective layer 15 is made of, for example, silicon oxide, silicon nitride (SiN) or silicon oxynitride (SiON). In an embodiment, the first protective layer 15 is made of SiN. The first protective layer 15 can be formed by CVD. The thickness of the first protective layer 15 is in a range from about 1 nm to about 20 nm in some embodiments.

After the first protective layer 15 is formed, a second protective layer 17 is formed as shown in FIG. 2A. The second protective layer 17 is made of, for example, silicon oxide, silicon nitride (SiN) or silicon oxynitride (SiON) and is different from the first protective layer 15. In an embodiment, the second protective layer 15 is made of silicon oxide. The second protective layer 17 can be formed by CVD. The thickness of the second protective layer 17 is in a range from about 1 nm to about 20 nm in some embodiments.

Figure 2B:
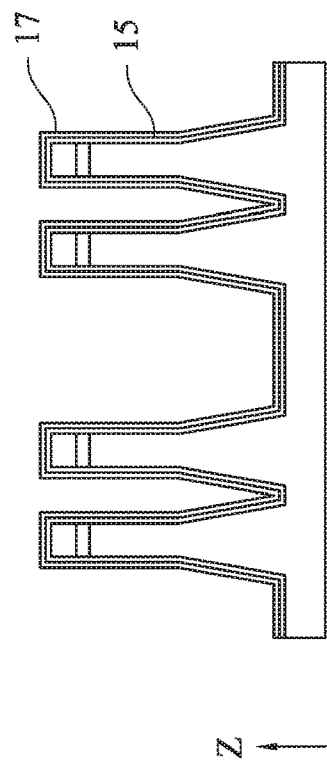

Further, an isolation insulating layer 58 is formed in spaces between the fin structures and/or a space between one fin structure and another element formed over the substrate 50, as shown in FIG. 2B. The isolation insulating layer 58 may also be called a "shallow-trench-isolation (STI)" layer. The insulating material for the isolation insulating layer 58 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous.

Figure 2C:
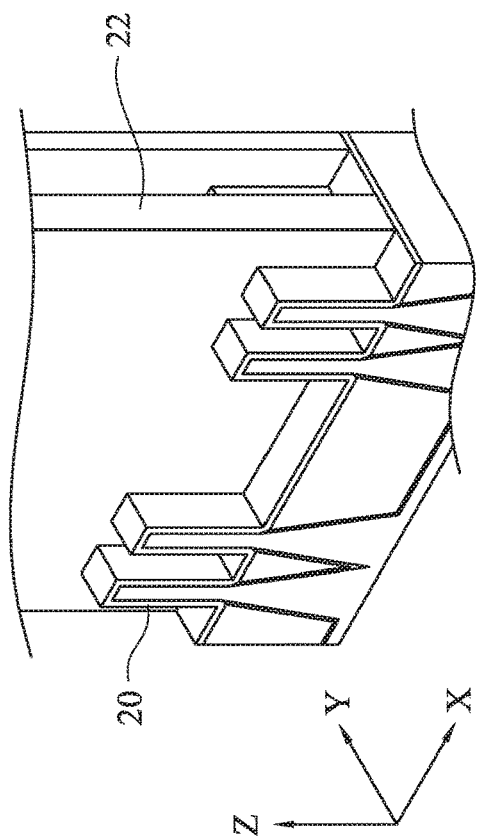

The insulating layer 58 is first formed in a thick layer as shown in FIG. 2B so that the fin structures are embedded in the thick layer, and the thick layer is recessed so as to expose the upper portions of the fin structures 52, 54, as shown in FIG. 2C. The insulating layer 58 can be recessed by using dry and/or wet etching. In some embodiments, the mask layers 11 and 12 and the first and second protective layers 15 and 17 are also removed from the exposed portions of the structures 52, 54.

The height H2 of the fin structures from the upper surface of the isolation insulating layer 58 is in a range from about 20 nm to about 100 nm in some embodiments, and is in a range from about 30 nm to about 50 nm in other embodiments. After or before recessing the isolation insulating layer 58, a thermal process, for example, an anneal process, may be performed to improve the quality of the isolation insulating layer 58. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or He ambient.

Figure 2D:
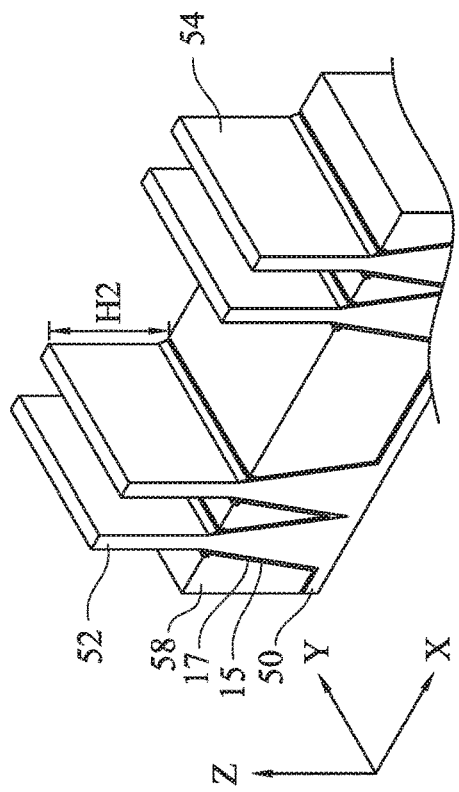

In some embodiments, a gate replacement technology is employed. After the insulating layer 58 is formed (and recessed), a dummy gate structure including a dummy gate dielectric layer 20 and a dummy gate electrode layer 22 is formed over the fin structures 52, 54, as shown in FIG. 2D. As shown in FIG. 2D, the gate structure extends in the X direction, while the fin structures extend in the Y direction.

To fabricate the dummy gate structure, a dielectric layer and a poly silicon layer are formed over the isolation insulating layer 58 and the exposed fin structures 52, 54, and then patterning operations are performed so as to obtain the dummy gate structure including a dummy gate electrode layer 22 made of poly silicon and a dummy gate dielectric layer 20. In some embodiments, the polysilicon layer is patterned by using a hard mask and the hard mask remains on the dummy gate electrode layer 22 as a cap insulating layer. The hard mask (cap insulating layer) includes one or more layers of insulating material. The cap insulating layer includes a silicon nitride layer formed over a silicon oxide layer in some embodiments. In other embodiments, the cap insulating layer includes a silicon oxide layer formed over a silicon nitride layer. The insulating material for the cap insulating layer may be formed by CVD, PVD, ALD, e-beam evaporation, or other suitable process. In some embodiments, the dummy gate dielectric layer 20 may include one or more layers of silicon oxide, silicon nitride, silicon oxy-nitride, or high-k dielectrics. In some embodiments, a thickness of the dummy gate dielectric layer 20 is in a range from about 2 nm to about 20 nm, and in a range from about 2 nm to about 10 nm in other embodiments. The height of the dummy gate structures is in a range from about 50 nm to about 400 nm in some embodiments, and is in a range from about 100 nm to 200 nm in other embodiments.

If a gate-first technology is employed, the dummy gate electrode layer 22 and the dummy gate dielectric layer 20 are used as a gate electrode and a gate dielectric layer.

Figure 3A:
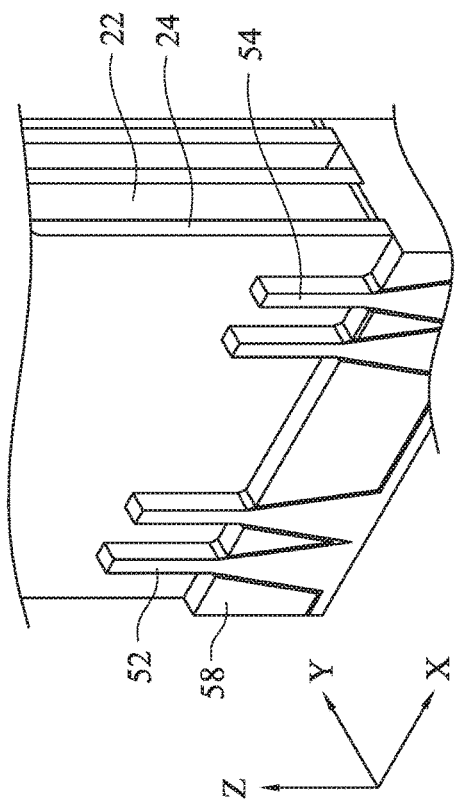
FIGS. 3A-3D show exemplary perspective views of various stages for manufacturing a semiconductor device according to some embodiments of the present disclosure.

Further, sidewall spacers 24 are formed on opposite sidewalls of the dummy gate electrode layer 22, as shown in FIG. 3A. The sidewall spacers 24 include one or more layers of insulating material, such as $SiO_2$, SiN, SiON, SiOCN or SiCN, which are formed by CVD, PVD, ALD, e-beam evaporation, or other suitable process. A low-k dielectric material may be used as the sidewall spacers. The sidewall spacers 24 are formed by forming a blanket layer of insulating material and performing anisotropic etching. In an embodiment, the sidewall spacer layers are made of silicon nitride based material, such as SiN, SiON, SiOCN or SiCN. The thickness of the sidewall spacers 24 is in a range from about 2 nm to about 10 nm in some embodiments.

Figure 3B:
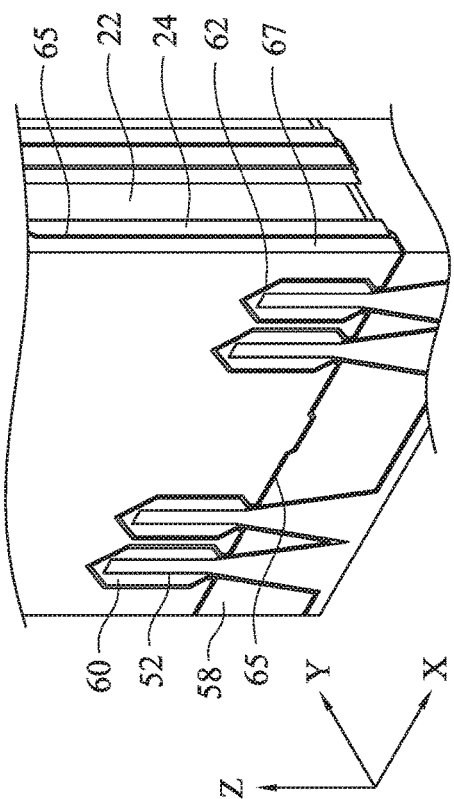

Then, as shown in FIG. 3B, the sidewall spacers 24 formed on the fin structures 52, 54 are removed by using, for example, anisotropic dry etching, so as to expose source/drain regions of the structures 52, 54.

Figure 3C:
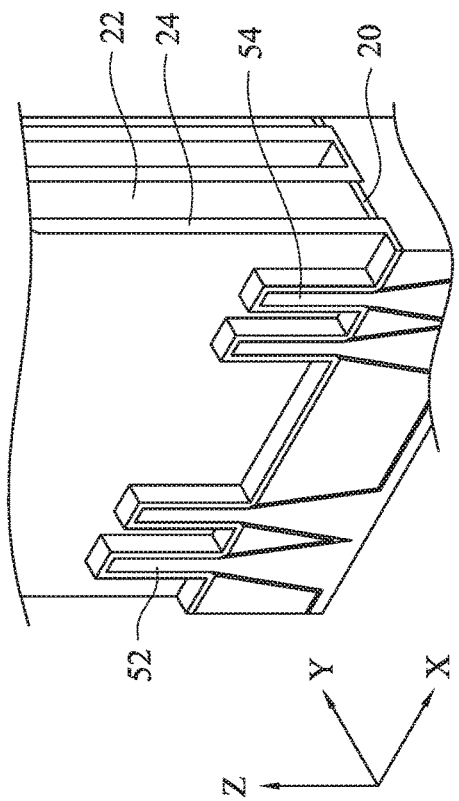

After the source/drain regions of the structures 52, 54 are exposed, source/drain epitaxial layers are formed, as shown in FIG. 3C. The source/drain epitaxial layer 60 for the n-type FET includes one or more layers of semiconductor material, such as, SiC, SiP and SiCP, which provides appropriate stress to the channel of the n-type FET, in some embodiments. When SiP or SiCP is used as multi epitaxial layers, the layers have different P and/or C concentrations. Since the fin structure 52 is a crystalline Si, the epitaxial layer 60 is also crystalline. The source/drain epitaxial layer 62 for the p-type FET includes one or more of a semiconductor material, such as, Ge and $Si_xGe_{1-x}$ where 0<x<1, which provides appropriate stress to the channel of the p-type FET, in some embodiments. When SiGe is used as the multi epitaxial layers, the layers have different Ge concentrations. Since the fin structures 52, 54 are crystalline Si, the epitaxial layers 60, 62 are also crystalline. In certain embodiments, a Group III-V material which provides appropriate stress to the channel is used as the source/drain epitaxial layers 60 and/or 62. In some embodiments, the source/drain epitaxial layers 60 and/or 62 include multiple layers of epitaxially formed semiconductor materials.

The source/drain epitaxial layers 60, 62 may be grown at a temperature of about 400 to 800° C. under a pressure of about 80 to 150 Torr, by using a Si containing gas such as $SiH_4$, $Si_2H_6$ or $SiCl_2H_2$; a Ge containing gas, such as $GeH_4$, $Ge_2H_6$ or $GeCl_2H_2$; a C containing gas, such as $CH_4$ or $C_2H_6$; and/or a dopant gas, such as $PH_3$. The source/drain structure for an n-type FET and the source/drain structure for a p-type FET may be formed by separate epitaxial processes.

In the present disclosure, after the source/drain epitaxial layers 60, 62 are formed, the source/drain epitaxial layer 60 formed on one fin structure 52 is not in contact with (i.e., physically separated from) the source/drain epitaxial layer 60 formed on the adjacent fin structure 52 as shown in FIG. 3C. Similarly, the source/drain epitaxial layer 62 formed on one fin structure 54 is not in contact with (i.e., physically separated from) the source/drain epitaxial layer 62 formed on the adjacent fin structure 54 as shown in FIG. 3C. The space S2 between the source/drain epitaxial layers 60 (or 62) is in a range from about 5 nm to 15 nm in some embodiments. The thicknesses of the source/drain epitaxial layers 60 and 62 are adjusted to secure the desired space S2 depending on the space 51 (see, FIG. 1C) between two fin structures.

Figure 3D:
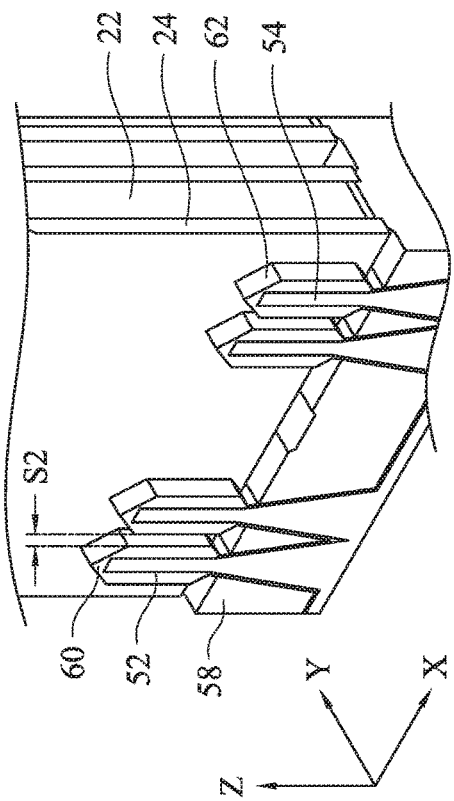

After the source/drain epitaxial layers 60 and 62 are formed, a dielectric cover layer 65 is formed over the source/drain epitaxial layers 60 and 62 and a first interlayer dielectric (ILD) layer 67 is formed over the dielectric cover layer 65, as shown in FIG. 3D. The dielectric cover layer 65 is made of, for example, SiN or SiON, and has a thickness in a range from about 2 nm to about 20 nm in some embodiments. The first ILD 67 is made of a different material than the dielectric cover layer 65 and is made of, for example, one or more layers of silicon oxide, SiCN, SiOCN or a low-k material.

Figure 4A:
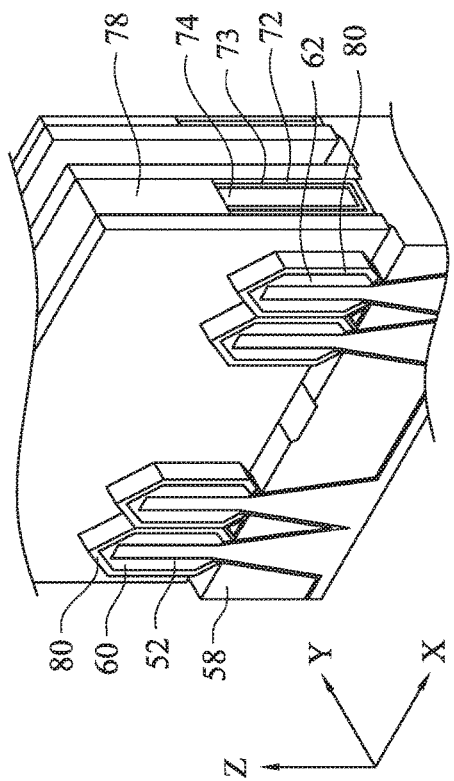
FIGS. 4A-4C show exemplary perspective views of various stages for manufacturing a semiconductor device according to some embodiments of the present disclosure.

After the ILD layer 67 is formed, a metal gate structure is formed. The dummy gate structures (the dummy gate electrode layer 22 and the dummy gate dielectric layer 20) are removed and replaced with a metal gate structures. In certain embodiments, the first ILD layer 67 is formed over the dummy gate structures and a planarization operation, such as a chemical mechanical polishing (CMP) process or an etch-back process, is performed to expose the upper surface of the dummy gate electrode layer 22. Then, the dummy gate electrode layer 22 and the dummy gate dielectric layer 20 are removed, by appropriate etching processes, respectively, to form a gate opening. A metal gate structure including a gate dielectric layer 72 and a metal gate electrode layer 74 are formed in the gate openings, as shown in FIG. 4A.

The gate dielectric layer 72 may be formed over an interface layer (not shown) disposed over the channel layer of the fin structures 52, 54. The interface layer may include silicon oxide or germanium oxide with a thickness of 0.2 nm to 1.5 nm in some embodiments. In other embodiments, the thickness of the interface layer is in a range about 0.5 nm to about 1.0 nm.

The gate dielectric layer 72 includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer is in a range from about 1 nm to about 10 nm in some embodiments, and may be in a range from about 2 nm to about 7 nm in other embodiments.

The metal gate electrode layer 74 is formed over the gate dielectric layer. The metal gate electrode includes one or more layers of any suitable metal material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments, one or more work function adjustment layer 73 is interposed between the gate dielectric layer 72 and the metal gate electrode layer 74, as shown in FIG. 4A.

The work function adjustment layer 73 is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel Fin FET, one or more of TaN, TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer.

After depositing appropriate materials for the metal gate structure, planarization operations, such as CMP, are performed. Further, in some embodiments, the metal gate structure is recessed to form a cap space, and the cap space is filled with an insulating material 78, as shown in FIG. 4A.

After the metal gate structure is formed, the first ILD layer 67 and dielectric cover layer 65 are removed. In an embodiment, the first ILD layer 67 and dielectric cover layer 65 are fully removed and in other embodiments, the first ILD layer 67 and dielectric cover layer 65 are partially removed from an area around the source/drain structures.

Figure 4B:
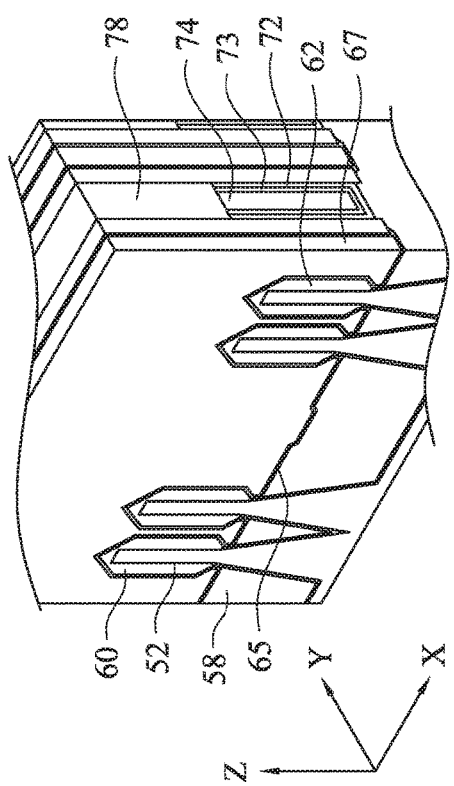

After the first ILD layer 67 is at least partially removed, a metal alloy layer 80, 81 is formed over the source/drain epitaxial layer 60 and 62, as shown in FIG. 4B.

The metal alloy layer 80, 81 is an alloy made of one or more Group IV element and one or more transition metal elements. When the source/drain epitaxial layer 60 and 62 are formed by silicon, the metal alloy layer 80, 81 is a silicide layer. When the source/drain epitaxial layer 60 and 62 are formed by germanium, the metal alloy layer 80, 81 is a germanide layer. When the source/drain epitaxial layer 60 and 62 are formed by SiGe, the metal alloy layer 80, 81 is a silicide-germanide layer.

The transition metal includes one or more of Ti, Ta, Ni and Co. The alloy layer 80, 81 is one or more of TiSi, TaSi, NiSi, CoSi, TiSiGe, TaSiGe, NiSiGe and CoSiGe.

After the first ILD layer 67 is removed, transition metal is deposited by, for example, CVD, ALD or PVD, on the source/drain epitaxial layer 60 and 62. During the deposition, the deposited transition metal reacts with Si and/or Ge in the source/drain epitaxial layer 60 and 62, thereby forming the alloy layer 80, 81 in some embodiments. In some embodiments, silicide (alloy) layer can be formed by PECVD, CVD, PEALD, or ALD metal deposit in a temperature range of about 250 to about 700° C., and then an in-situ dry etching using Cl or F based gas or ex-situ wet selective etching is applied to remove the remaining metal on spacer and the isolation insulating layer. In other embodiments, the silicide (alloy) layer can be formed by PECVD, CVD, PEALD, or ALD metal deposit in a temperature range of about 350 to about 650° C. In certain embodiments, a nitridation treatment is later performed to passivate silicide surface for the subsequent silicide formation anneal. In other embodiments, a selective silicide deposition process through surface blocking by self-assembly molecular (SAMs), or inherent selective formation from proper metal and silicon precursors is performed. Other suitable silicide formation processes may be utilized.

In the present embodiments, before the alloy layer 80 is formed, the source/drain epitaxial layer 60 of one of the fin structures is separated from the source/drain epitaxial layer 60 of the adjacent fin structure, and the source/drain epitaxial layer 62 of one of the fin structures is separated from the source/drain epitaxial layer 62 of the adjacent fin structure. The alloy layer 80, 81 is formed such that the formed alloy layer 80 connects the source/drain epitaxial layer 60 of one of the fin structures (52) and the source/drain epitaxial layer 60 of the adjacent fin structure (52), and the formed alloy layer 81 connects the source/drain epitaxial layer 62 of one of the fin structures (54) and the source/drain epitaxial layer 62 of the adjacent fin structure (54).

In some embodiments, after a transition metal layer is formed on the source/drain epitaxial layer 60 and 62, an annealing operation is performed to form the alloy layer 80. The annealing operation is performed at a temperature of about 250° C. to about 850° C.

Figure 4C:
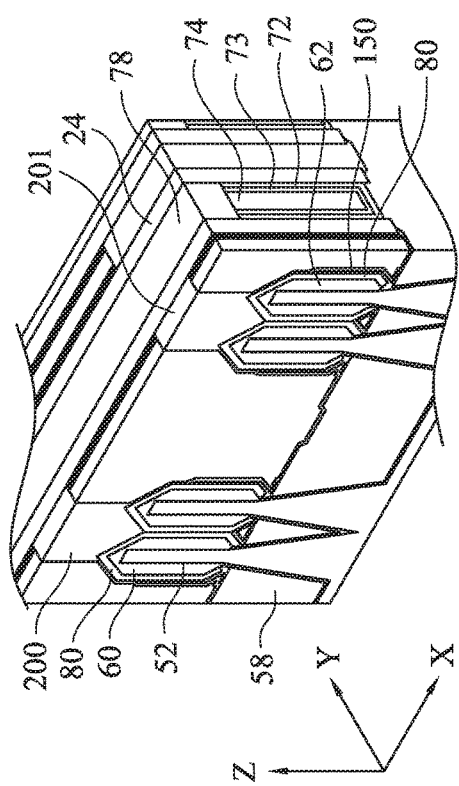

After the alloy layer 80, 81 is formed, a contact-etch stop layer (CESL) 150 is formed to cover the alloy layer 80, 81, and a second ILD layer 160 is formed on the CESL 150, as shown in FIG. 4C. The CESL 150 is made of a silicon nitride based material, such as SiN and SiON, and has a thickness in a range from about 2 nm to about 20 nm in some embodiments. The second ILD 160 is made of a different material than the CESL 150 and is made of, for example, one or more layers of silicon oxide, SiCN, SiOCN or a low-k material.

Subsequently, a patterning operation is performed to form contact openings over the alloy layer 80, 81 of the source/drain structure, and the openings are filled with a conductive material, thereby forming contact plugs 200 and 201, as shown in FIG. 4C. The contact plugs 200 and 201 include a single layer or multiple layers of any suitable metal such as Co, W, Ti, Ta, Cu, Al and/or Ni and/or nitride of Ti or Ta.

After forming the contact plugs, further CMOS processes are performed to form various features such as one or more additional interlayer dielectric layers, contacts/vias, interconnect metal layers, and passivation layers, etc.

Although in the foregoing embodiments and the following embodiments, an n-channel FET and a p-channel FET are illustrated adjacent to each other, the arrangement of the n-channel FET and the p-channel FET is not limited to such an arrangement.

FIGS. 5A-6C show exemplary cross sectional views of various stages for manufacturing a FinFET according to another embodiment of the present disclosure. It is understood that additional operations can be provided before, during, and after processes shown by FIGS. 5A-6C, and some of the operations described below can be replaced or eliminated, for additional embodiments of the method. The order of the operations/processes may be interchangeable. The same or similar configurations, materials, processes and/or operation as described with FIG. 1A-4C may be employed in the following embodiments, and the detailed explanation may be omitted.

Figure 5A:
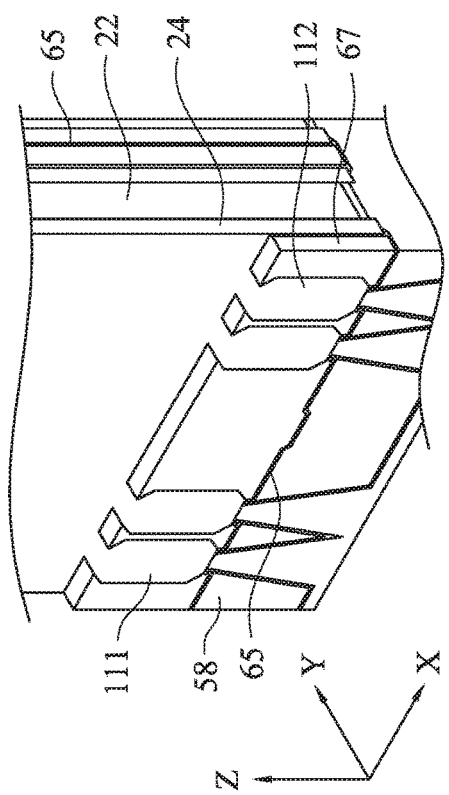
FIGS. 5A-5D show exemplary perspective views of various stages for manufacturing a semiconductor device according to another embodiment of the present disclosure.

After the structure as shown in FIG. 3D is formed, the first ILD 67 is recessed by dry and/or wet etching so as to the top portions of the source/drain epitaxial layers 60 and 62 are exposed, as shown in FIG. 5A.

Figure 5B:
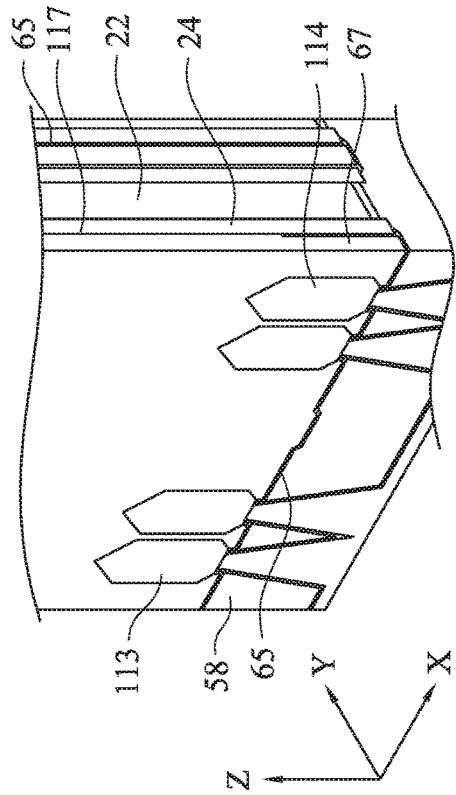

Then, as shown in FIG. 5B, the source/drain epitaxial layers 60 and 62 and the fin structures 52 are removed by dry and/or wet etching so as to form openings 111 and 112. The fin structures 52 are recessed to the level of the upper surface of the isolation insulating layer 58. In some embodiments, the fin structures 52 are recessed below the upper surface of the isolation insulating layer 58. After the openings 111, 112 are formed, a source/drain epitaxial layer 113 for an n-channel FET and a source/drain epitaxial layer 114 for a p-channel FET are formed, as shown in FIG. 5C.

Figure 5C:
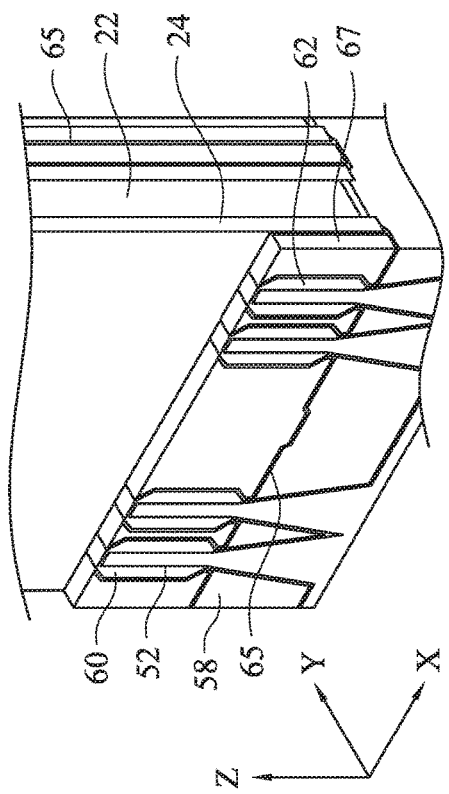

In some embodiments, after the first ILD layer 67 is recessed, one of the n-channel FET region and the p-channel FET region is covered by a protective layer (e.g., SiN) and the operations as explained with FIGS. 5B and 5C are performed separately for the n-channel FET region and the p-channel FET region, respectively.

The source/drain epitaxial layer 113 for the n-channel FET includes one or more layers of Si, SiC, SiP and SiCP, and the source/drain epitaxial layer 114 for the p-channel FET includes one or more layers of Ge and $Si_xGe_{1-x}$, where $0<x<1$.

Figure 5D:
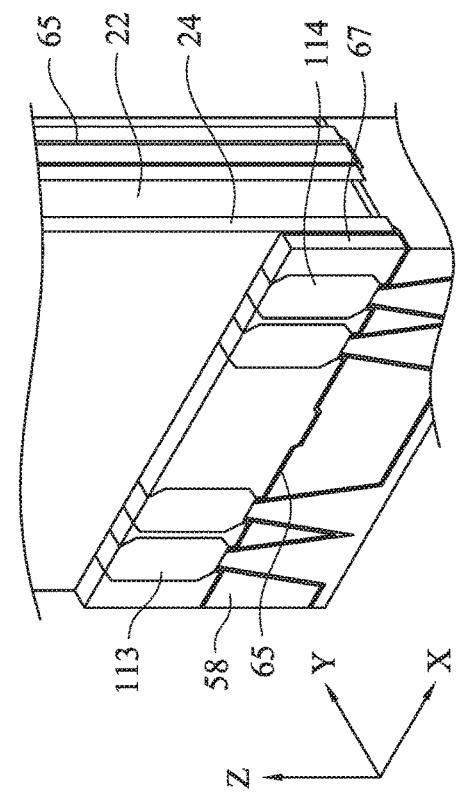

Subsequently, an ILD layer 117 is formed over the source/drain epitaxial layers 113 and 114 and the first ILD layer 67, as shown in FIG. 5D. The ILD layer 117 is made of the same or similar material as the first ILD layer 67.

Then, the same or similar operations as described with FIG. 4A are performed and a metal gate structure including a gate dielectric layer 72 and a metal gate electrode layer 74 are formed, as shown in FIG. 6A. Further, the same or similar operations as described with FIG. 4B are performed, an alloy layer 80, 81 are formed so as to connect two adjacent source/drain epitaxial layers, as shown in FIG. 6B. Subsequently, he same or similar operations as described with FIG. 4C are performed, contact plugs 200 and 201 are formed, as shown in FIG. 6C. After forming the contact plugs, further CMOS processes are performed to form various features such as additional interlayer dielectric layer, contacts/vias, interconnect metal layers, and passivation layers, etc.

FIGS. 7-14 are exemplary cross sectional views of source/drain structures of a fin field effect transistor (FinFET) according to various embodiments of the present disclosure. In FIGS. 7-14, an n-channel FET (NFET) and a p-channel FET (PFET), each of which includes two fin structures 52, 54 are illustrated as adjacent to each other. However, the configuration is not limited to this. The number of the fin structures may be three or more and one or more additional structures may be disposed between the NFET and the PFET.

Figure 7:
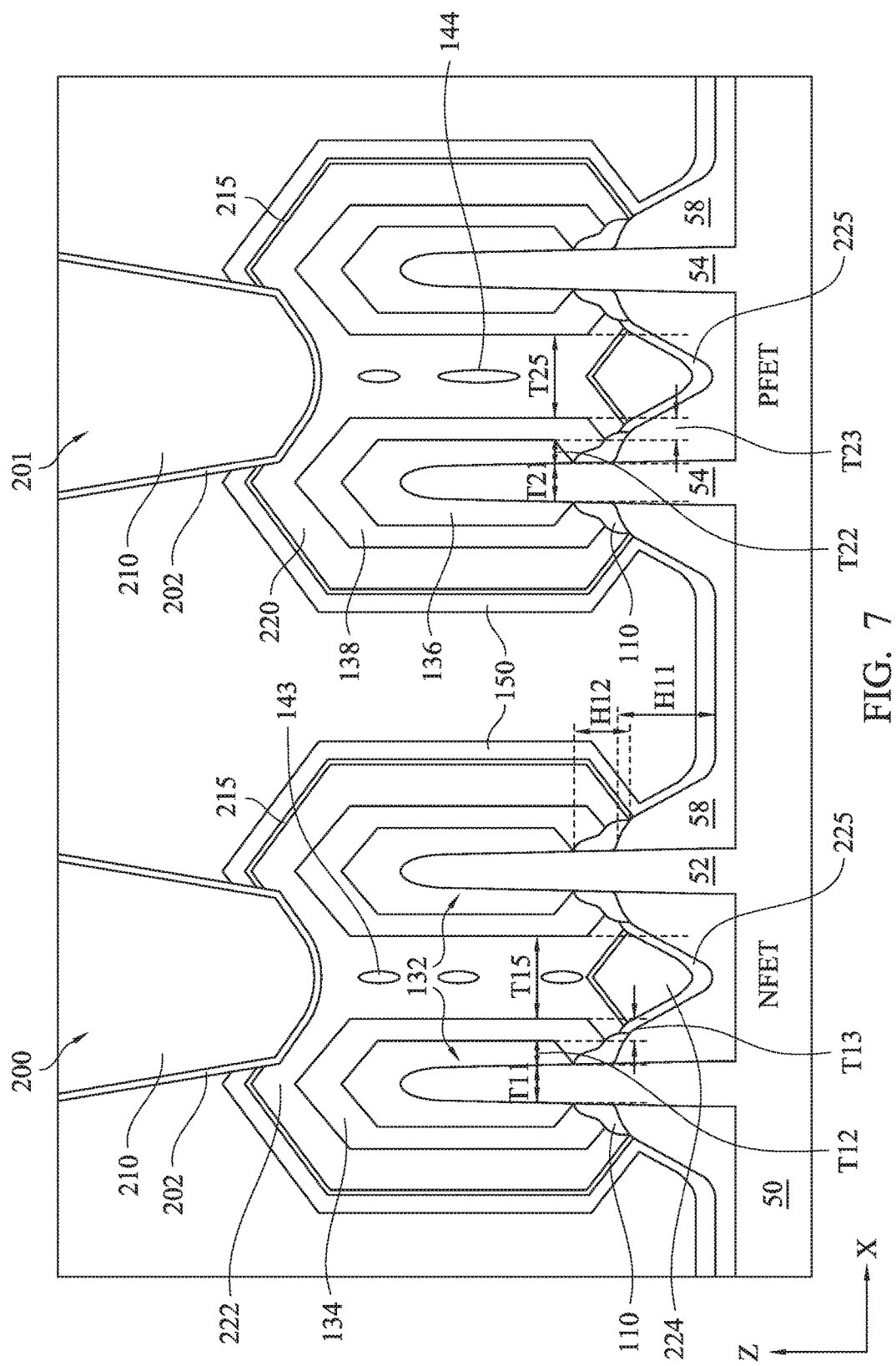
FIG. 7 is an exemplary cross sectional view of source/drain structures of a fin field effect transistor (FinFET) according to some embodiments of the present disclosure.

In FIG. 7, in the n-channel FET (NFET), a first n-type epitaxial layer 132 is formed on the fin structure 52, and a second n-type epitaxial layer 134 is formed on the first n-type epitaxial layer 132. The first and second n-type epitaxial layers are crystalline semiconductor layers, such as Si, SiC, SiCP, SiP, Ge and SiGe, having different lattice constants from each other and from the fin structure. When SiC, SiP and/or SiCP are used, the C or P concentration of the second n-type epitaxial layer 134 is higher than that of the first n-type epitaxial layer 132. In some embodiments, a Group III-V semiconductor layer is used for at least one of the first and second n-type epitaxial layers. The combination of the first and second n-type epitaxial layers 132 and 134 correspond to the source/drain epitaxial layer 60. In other embodiments, only one of the first and second n-type epitaxial layers 132 and 134 is formed, and in certain embodiments, three or more n-type epitaxial layers are formed.

Further, the alloy layer 222, for example, a silicide layer, which corresponds to the alloy layer 80, is formed on the second n-type epitaxial layer 134. The alloy layer 222 is formed by a reaction between the material of the second n-type epitaxial layer 134 and a transition metal layer formed thereon. As shown in FIG. 7, the second n-type epitaxial layer 134 of one of the adjacent two fin structure 52 does not touch the second n-type epitaxial layer 134 of the other one of the adjacent two fin structure 52. The alloy layer 222 fills the space between two second n-type epitaxial layers 134 and physically and electrically connects the two second n-type epitaxial layers 134.

In some embodiments, a residual transition metal 215, which has not fully reacted with the second n-type epitaxial layer 134 remain. In such a case, the remaining transition metal can be converted to a passivation layer by a subsequent nitridation operation by using $NH_3$ or $N_2+H_2$ plasma in some embodiments. The passivation layer covers the surface of the alloy layer 222 to protect the alloy layer 222 from damages caused by the subsequent processes. Further, a CESL 150 covers the n-type source/drain structure, as shown in FIG. 7.

The contact plug 200 is in contact with the alloy layer 222. In some embodiments, the contact plug 200 includes a barrier layer 202 made of, for example, TiN or TaN, and a body layer 210 made of, for example, Co, W, Ti, Ta, Cu, Ru, Rh, Jr, Al and/or Ni.

In FIG. 7, a transition metal layer 225 remains at the bottom of the void 224 formed by the alloy layer 222 and the isolation insulating layer 58. The volume of the transition metal layer 225 is sufficiently small so as not to affect electrical properties of the NFET.

Further, in FIG. 7, spacer residues 110, which are a remaining part of the sidewall spacers 24 that is not etched in the operation of FIG. 3B, exist.

The width T11 (the largest width) of the fin structure 52 surrounded by the first n-type epitaxial layer along the X direction is in a range from about 4 nm to about 10 nm in some embodiments. The thickness T12 of the first n-type epitaxial layer 132 is in a range from about 0.5 nm to about 3 nm in some embodiments, and the thickness T13 of the second n-type epitaxial layer 134 is in a range from about 2 nm to about 8 nm in some embodiments. The space T15 between the two adjacent second n-type epitaxial layers 134 is in a range from about 0.5 nm to about 20 nm in some embodiments. In some embodiments, the isolation insulating layer 58 is etched in the operation of FIG. 3B, and the etched amount H11 is in a range from about 0.5 nm to about 20 nm. The vertical thickness of the spacer residue 110 is in a range from about 0.5 nm to about 30 nm in some embodiments.

In some embodiments, one or more voids 143 are formed during the alloy layer formation. The shapes of the voids 143 in the cross section may include a rhombus, a circle, an oval or an irregular shape. The shapes may be symmetry or asymmetric. The number of the voids may be as small as one in some embodiments, and more than one in other embodiments. Sizes of the multiple voids and spaces between voids may be substantially the same or different.

The p-channel FET (PFET) shown in FIG. 7 has the same or similar structure as the n-channel FET (NFET), and explanations for the common configurations may be omitted. A first p-type epitaxial layer 136 is formed on the fin structure 54, and a second p-type epitaxial layer 138 is formed on the first p-type epitaxial layer 136. The first and second p-type epitaxial layers are crystalline semiconductor layers, such as Si, SiC, SiCP, SiP, Ge and SiGe, having different lattice constants from each other and from the fin structure. When SiGe is used, the Ge concentration of the second p-type epitaxial layer 138 is higher than that of the first p-type epitaxial layer 136. In some embodiments, a Group III-V semiconductor layer is used for at least one of the first and second p-type epitaxial layers. The combination of the first and second p-type epitaxial layers 136 and 138 correspond to the source/drain epitaxial layer 62. In other embodiments, only one of the first and second p-type epitaxial layers 136 and 138 is formed, and in certain embodiments, three or more p-type epitaxial layers are formed.

Further, the alloy layer 220, for example, a silicide layer, which corresponds to the alloy layer 81, is formed one the second p-type epitaxial layer 138. The alloy layer 220 is formed by a reaction between the material of the second p-type epitaxial layer 138 and a transition metal layer formed thereon. As shown in FIG. 7, the second p-type epitaxial layer 138 of one of the adjacent two fin structure 54 does not touch the second p-type epitaxial layer 138 of the other one of the adjacent two fin structure 54. The alloy layer 220 fills the space between two second p-type epitaxial layers 138 and physically and electrically connects the two second p-type epitaxial layers 138.

In some embodiments, a residual transition metal 215, which has not fully reacted with the second p-type epitaxial layer 138 remain. In such a case, the remaining transition metal can be converted to a passivation layer by a subsequent nitridation operation by using $NH_3$ or $N_2+H_2$ plasma in some embodiments. The passivation layer covers the surface of the alloy layer 220 to protect the alloy layer 220 from damages caused by the subsequent processes. Further, a CESL 150 covers the p-type source/drain structure, as shown in FIG. 7.

The contact plug 201 is in contact with the alloy layer 222. In some embodiments, the contact plug 201 includes a barrier layer 202 made of, for example, TiN or TaN, and a body layer 210 made of, for example, Co, W, Ti, Ta, Cu, Ru, Rh, Ir, Al and/or Ni.

In FIG. 7, a transition metal layer 225 remains at the bottom of the void 224 formed by the alloy layer 222 and the isolation insulating layer 58. Since the volume of the transition metal layer 225 is sufficiently small not to affect electrical properties of the NFET.

Further, in FIG. 7, spacer residues 110, which is a remaining part of the sidewall spacers 24 that is not etched in the operation of FIG. 3B, exit.

The width T21 (the largest width) of the fin structure 54 surrounded by the first p-type epitaxial layer along the X direction is in a range from about 4 nm to about 10 nm in some embodiments. The thickness T22 of the first p-type epitaxial layer 136 is in a range from about 0.5 nm to about 3 nm in some embodiments, and the thickness T23 of the second p-type epitaxial layer 138 is in a range from about 2 nm to about 8 nm in some embodiments. The space T25 between the two adjacent second p-type epitaxial layers 138 is in a range from about 0.5 nm to about 20 nm in some embodiments.

In some embodiments, one or more voids 144 are formed during the alloy layer formation. The shapes of the voids 144 in the cross section may include a rhombus, a circle, an oval or an irregular shape. The shapes may be symmetry or asymmetric. The number of the voids may be as small as one in some embodiments, and more than one in other embodiments. Sizes of the multiple voids and spaces between voids may be substantially the same or different.

Figure 8:
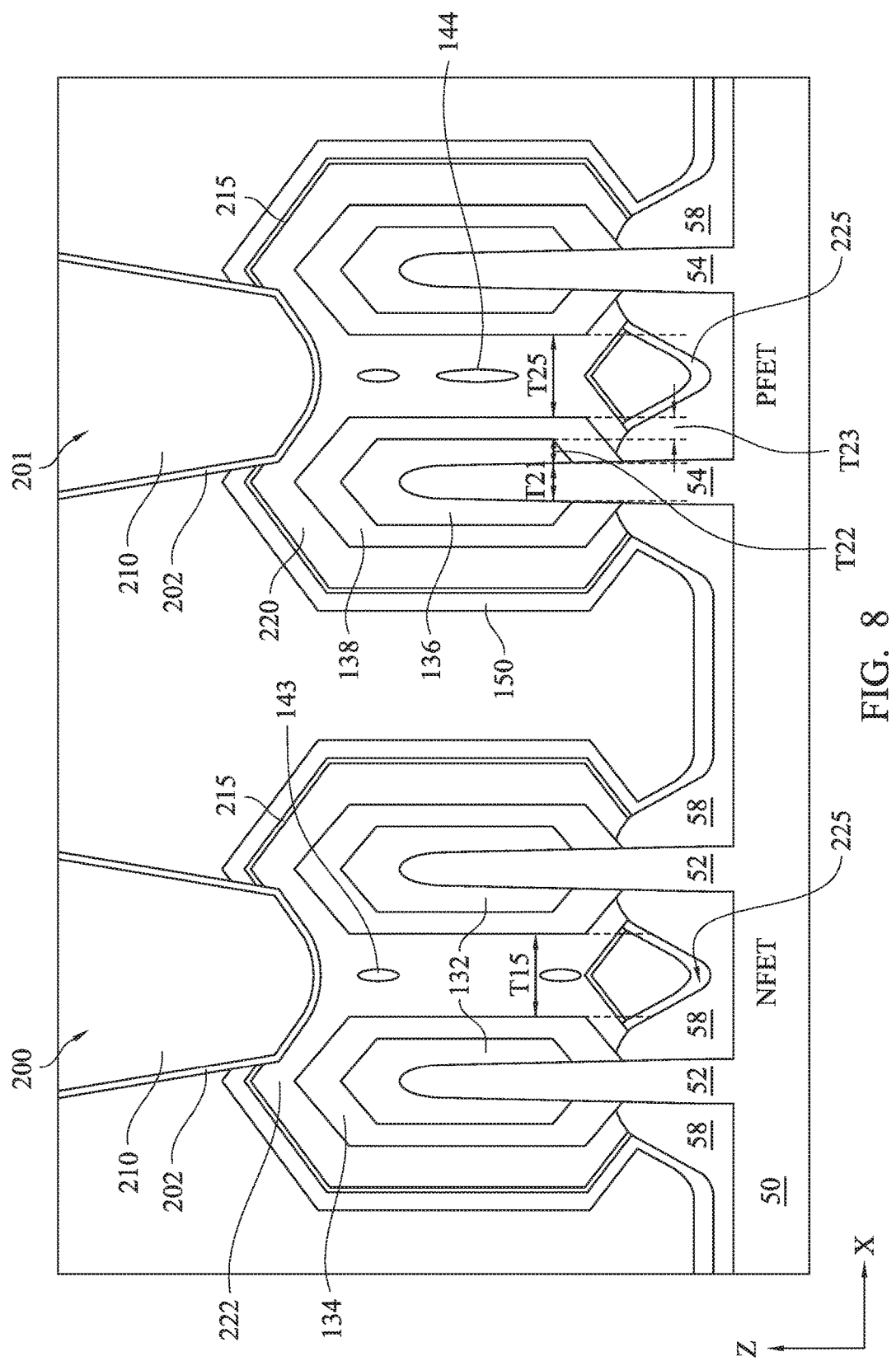
FIG. 8 is an exemplary cross sectional view of source/drain structures of a FinFET according to some embodiments of the present disclosure.

FIG. 8 is an exemplary cross sectional view of source/drain structures of a FinFET according to another embodiment of the present disclosure. FIG. 8 shows the substantially the same structures as FIG. 7, except there are no spacer residues 110 in this embodiment.

Figure 9:
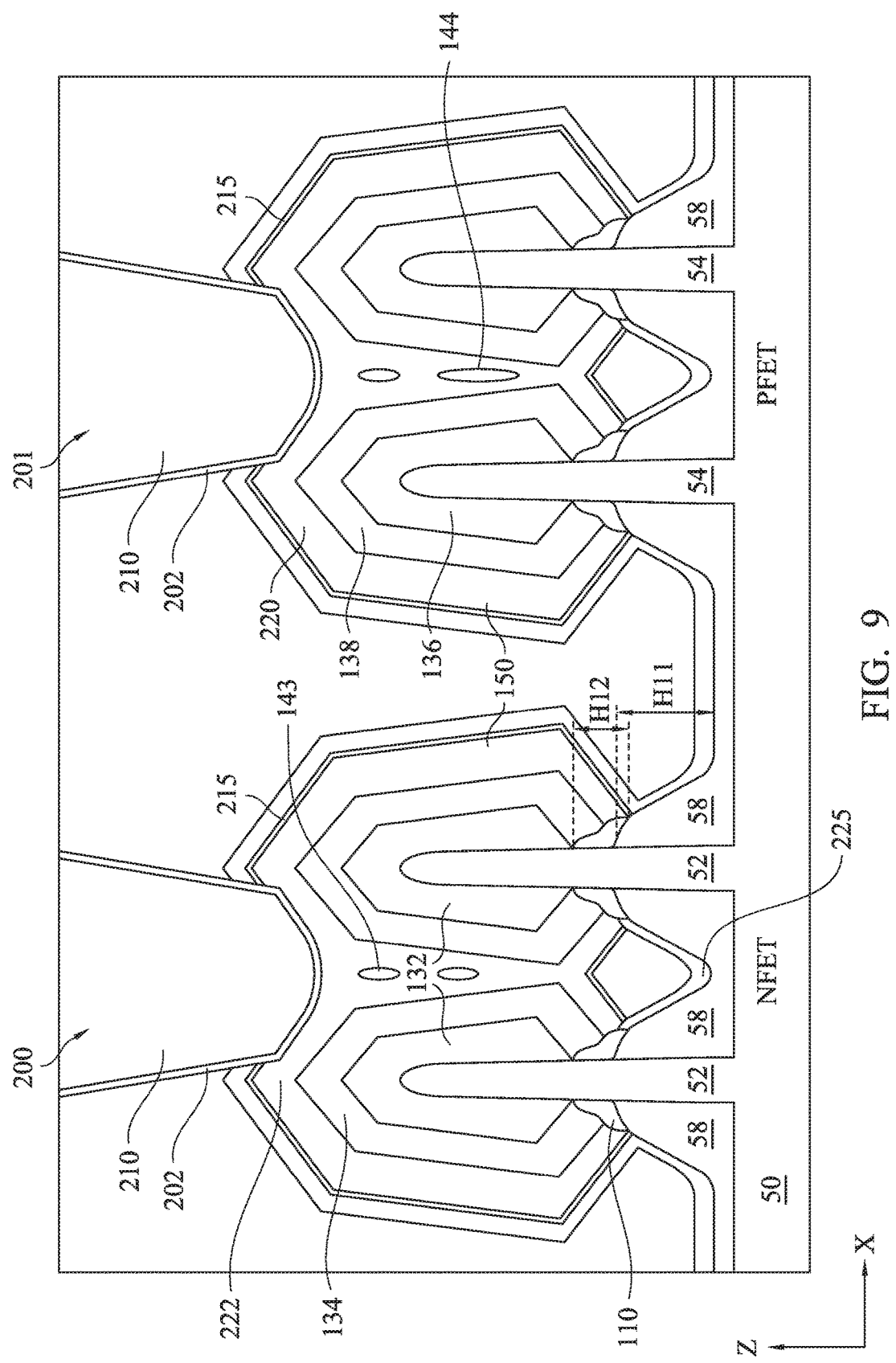
FIG. 9 is an exemplary cross sectional view of source/drain structures of a FinFET according to some embodiments of the present disclosure.

FIG. 9 is an exemplary cross sectional view of source/drain structures of a FinFET according to another embodiment of the present disclosure. FIG. 9 shows the substantially the same structures as FIG. 7, except for the shape of the source/drain epitaxial layers. In FIG. 9, the shape of the source/drain epitaxial layers (e.g., 132, 134, 136 and 138) has a tapered shape having a larger bottom area than an upper area. Depending on the epitaxial growth conditions, the shapes of the source/drain epitaxial layers may vary.

Figure 10:
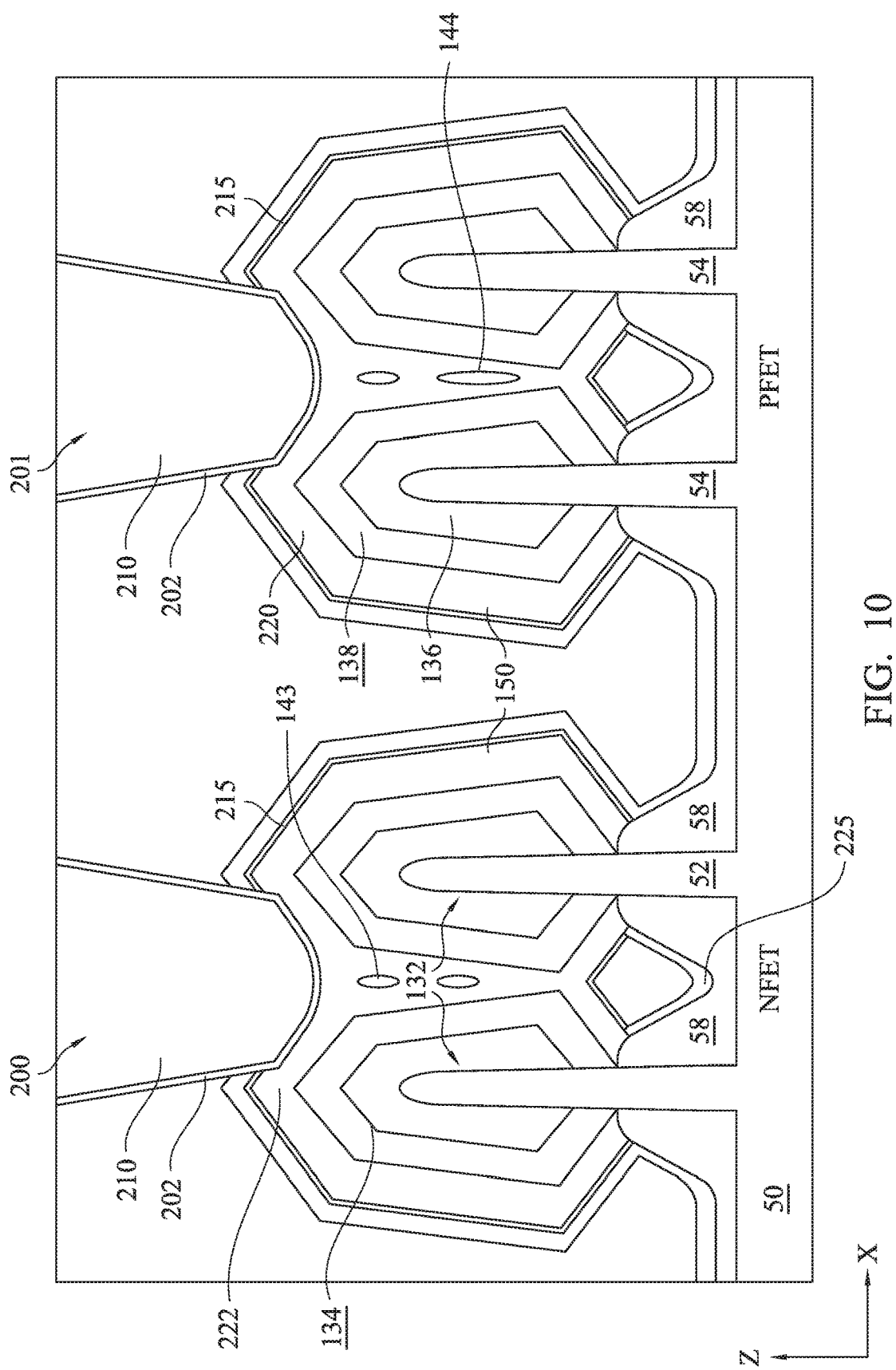
FIG. 10 is an exemplary cross sectional view of source/drain structures of a FinFET according to some embodiments of the present disclosure.

FIG. 10 is an exemplary cross sectional view of source/drain structures of a FinFET according to another embodiment of the present disclosure. FIG. 10 shows the substantially the same structures as FIG. 9, except there are no spacer residues 110 in this embodiment.

Figure 11:
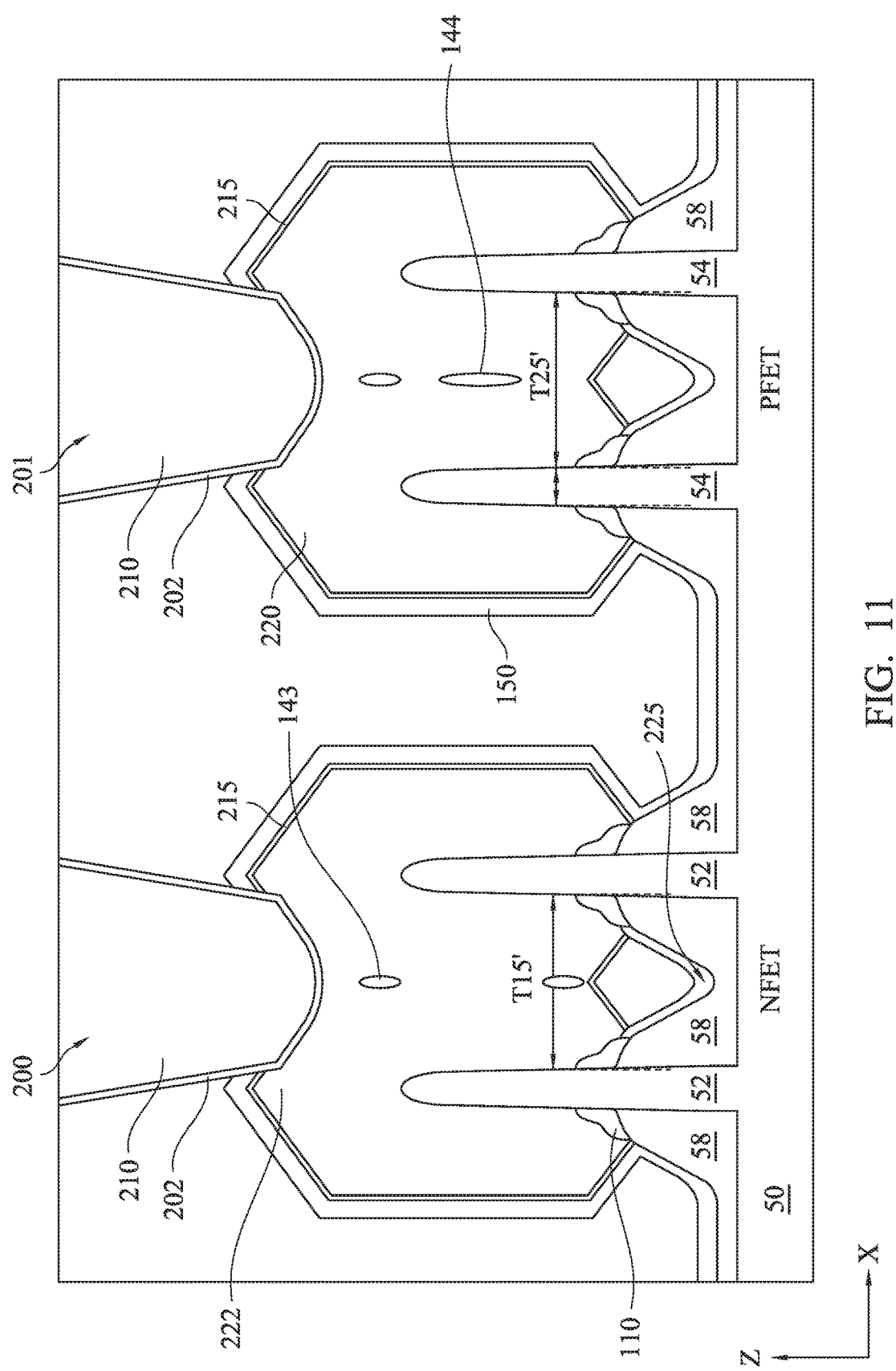
FIG. 11 is an exemplary cross sectional view of source/drain structures of a FinFET according to some embodiments of the present disclosure.

FIG. 11 is an exemplary cross sectional view of source/drain structures of a FinFET according to another embodiment of the present disclosure. In FIG. 11, no source/drain epitaxial layers are formed on the fin structures 52. After the structure shown in FIG. 3B is formed, the first ILD 67 is formed without forming the source/drain epitaxial layers 60, 62. By performing the same or similar operations as FIGS. 3D-4C, the structure of FIG. 11 can be obtained.

In FIG. 11, the alloy layers 220 or 222 directly wraps around the fin structure 52 made of a crystalline semiconductor. The spaces T15' and T25' between two fin structures covered by the alloy layer 220, 222 is in a range from about 8 nm to about 60 nm in some embodiments.

Although FIG. 11 illustrated the spacer residues 110, in certain embodiments, the spacer residues 110 do not remain.

Figure 12:
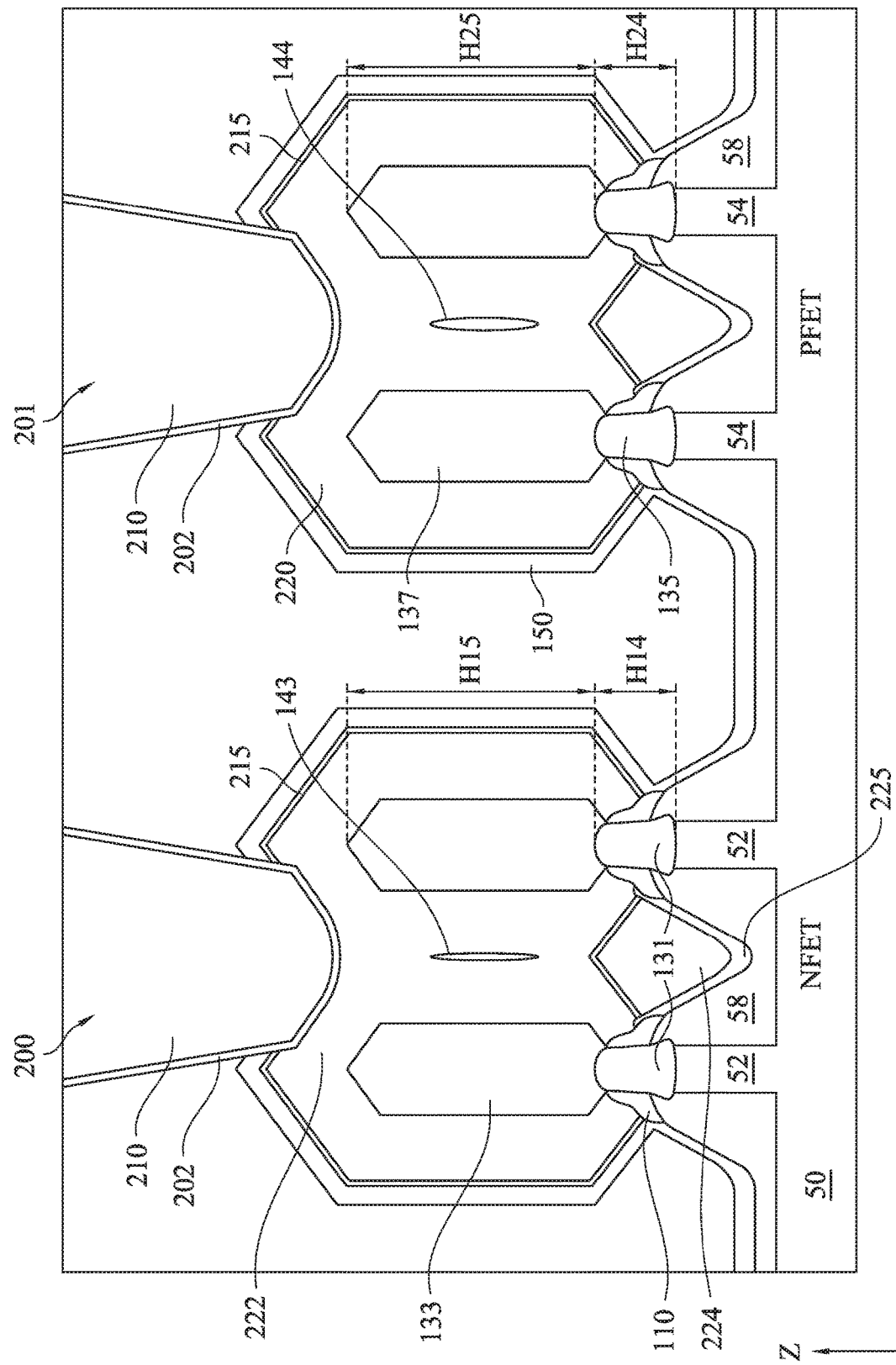
FIG. 12 is an exemplary cross sectional view of source/drain structures of a FinFET according to some embodiments of the present disclosure.
Figure 13:
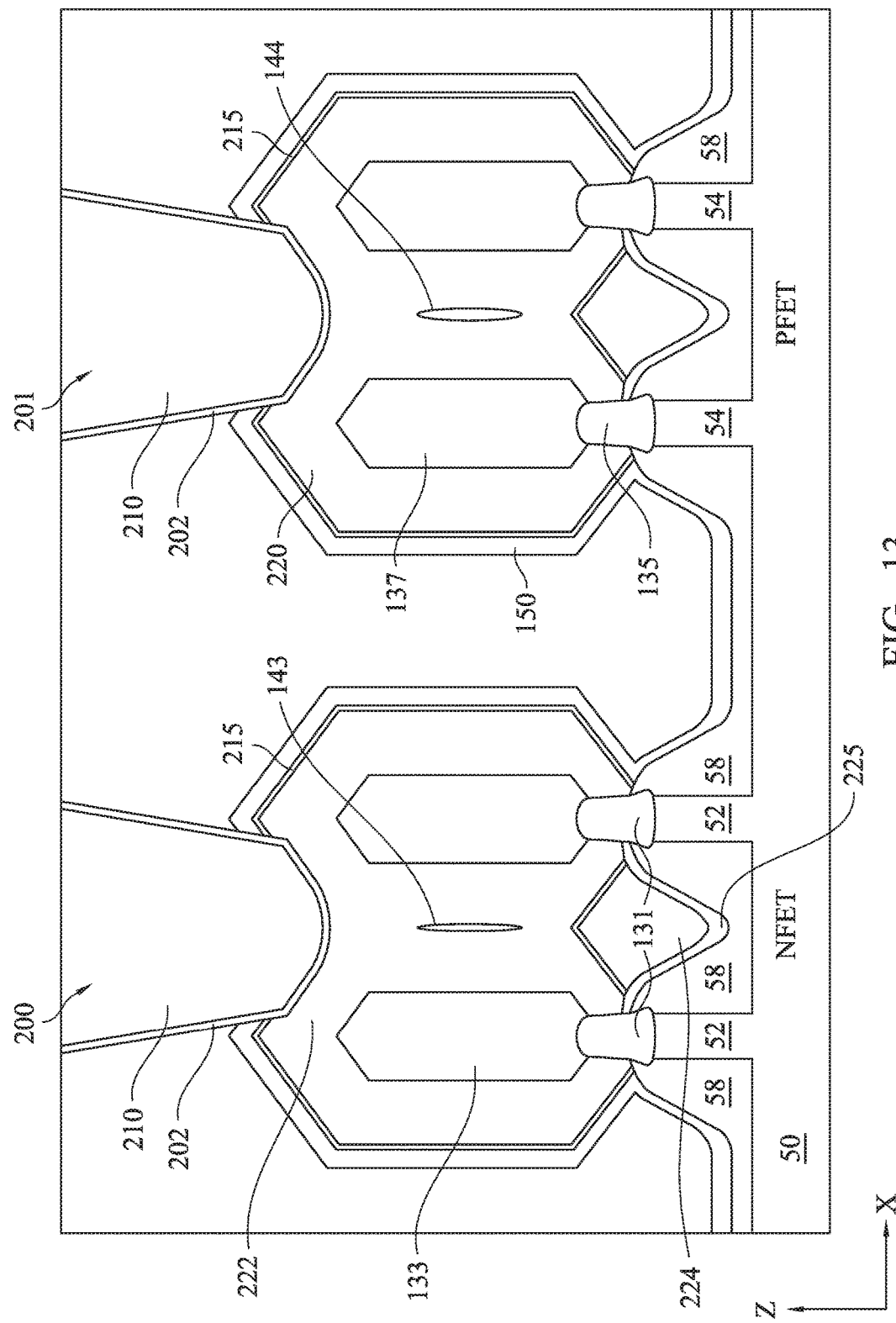
FIG. 13 is an exemplary cross sectional view of source/drain structures of a FinFET according to some embodiments of the present disclosure.
Figure 14:
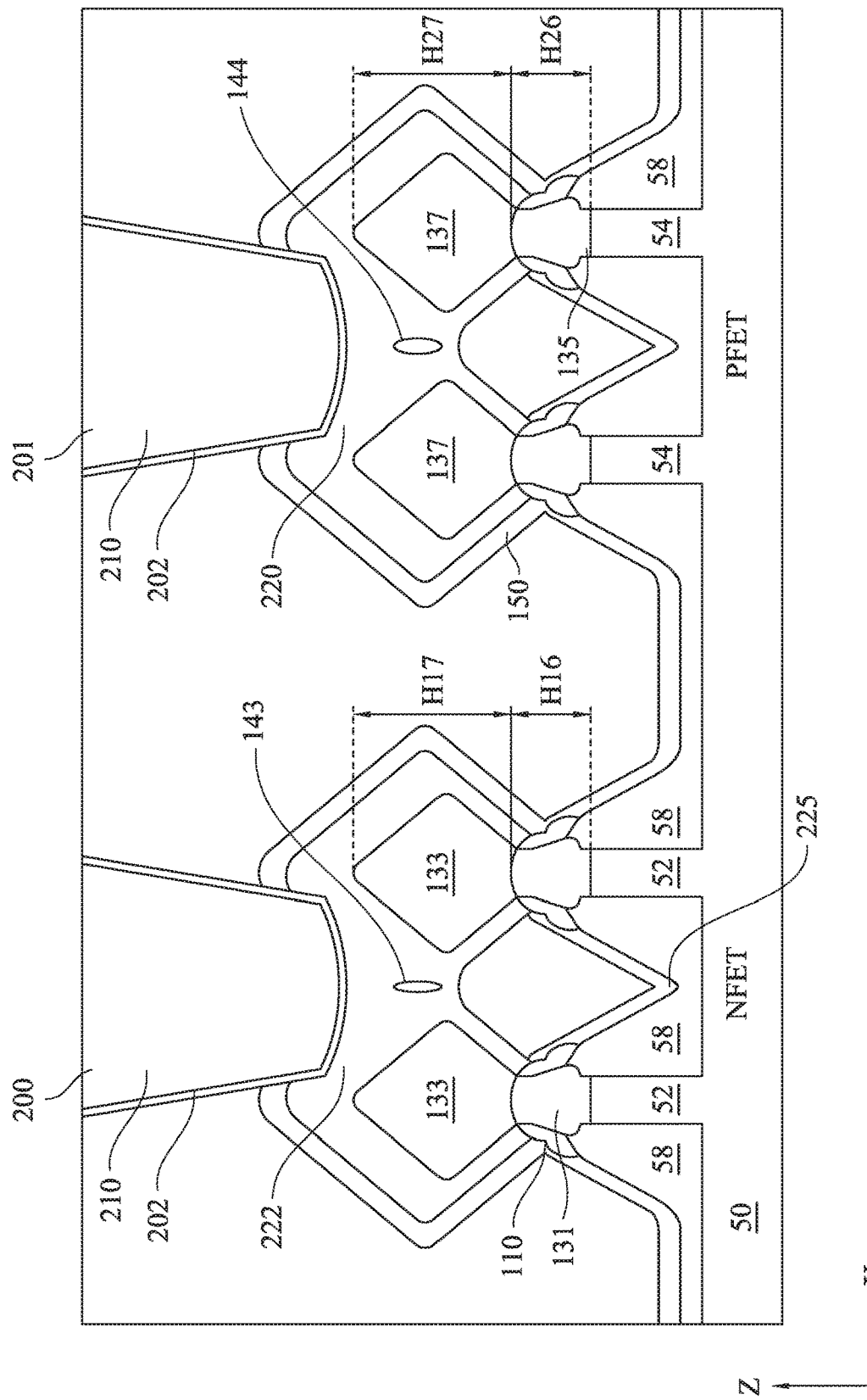
FIG. 14 is an exemplary cross sectional view of source/drain structures of a FinFET according to some embodiments of the present disclosure.

FIGS. 12-14 are exemplary cross sectional views of source/drain structures of a FinFET according to the methods shown by FIGS. 5A-6C. The same or similar configurations, structures and/or materials as those of FIGS. 7-11 may be employed, and the detailed explanation may be omitted.

After the source/drain epitaxial layers 60 and 62 and the fin structures 52 are recessed as shown in FIG. 5B, a first n-type epitaxial layer 131 is formed on the recessed fin structure 52, and a second n-type epitaxial layer 133 is formed on the first n-type epitaxial layer 131 for the n-channel FET, and a first p-type epitaxial layer 135 is formed on the recessed fin structure 54, and a second p-type epitaxial layer 137 is formed on the first n-type epitaxial layer 135 for the p-channel FET. The combination of the first and second n-type epitaxial layers corresponds to the source/drain epitaxial layer 113, and the combination of the first and second p-type epitaxial layers corresponds to the source/drain epitaxial layer 114.

The first and second n-type epitaxial layers 131, 133 are crystalline semiconductor layers, such as Si, SiC, SiCP, SiP, Ge and SiGe, having different lattice constants from each other and from the fin structure. When SiC, SiP and/or SiCP are used, the C or P concentration of the second n-type epitaxial layer 131 is higher than that of the first n-type epitaxial layer 133. In some embodiments, a Group III-V semiconductor layer is used for at least one of the first and second n-type epitaxial layers. In other embodiments, only one of the first and second n-type epitaxial layers 131 and 133 is formed, and in certain embodiments, three or more n-type epitaxial layers are formed.

The first and second p-type epitaxial layers 135, 137 are crystalline semiconductor layers, such as Si, SiC, SiCP, SiP, Ge and SiGe, having different lattice constants from each other and from the fin structure. When SiGe is used, the Ge concentration of the second p-type epitaxial layer 137 is higher than that of the first p-type epitaxial layer 135. In some embodiments, a Group III-V semiconductor layer is used for at least one of the first and second p-type epitaxial layers. In other embodiments, only one of the first and second p-type epitaxial layers 135 and 137 is formed, and in certain embodiments, three or more p-type epitaxial layers are formed.

Since the first and second n-type and p-type epitaxial layers are formed in the openings 111 and 112 shown in FIG. 5B, the shapes of the epitaxial layers are restricted by the shapes of the openings 111 and 112.

The thickness H14 of the first n-type epitaxial layer 131 is in a range from about 0.5 nm to about 3 nm in some embodiments, and the thickness H15 of the second n-type epitaxial layer 133 is in a range from about 2 nm to about 100 nm in some embodiments. The thickness H24 of the first p-type epitaxial layer 135 is in a range from about 0.5 nm to about 3 nm in some embodiments, and the thickness H25 of the second p-type epitaxial layer 137 is in a range from about 2 nm to about 100 nm in some embodiments.

FIG. 13 is an exemplary cross sectional view of source/drain structures of a FinFET according to some embodiments of the present disclosure. FIG. 13 shows the substantially the same structures as FIG. 12, except there are no spacer residues 110 in this embodiment.

FIG. 14 is an exemplary cross sectional view of source/drain structures of a FinFET according to another embodiment of the present disclosure.

After the structure of FIG. 3A is formed, the fin structures 52 are recessed to or below the isolation insulating layer 58, and then epitaxial source/drain structures are formed on the recessed fin structure 52. Subsequently, a cover layer 60 and a first ILD layer 67 are formed, and the operations the same as or similar to FIGS. 4A-4C or 6A-6C are performed. In this embodiment, since the source/drain epitaxial layers are not formed in the openings, the source/drain epitaxial layers are laterally grown so as to have a diamond cross sectional shape, as shown in FIG. 14.

In more detail, after the fin structures 52 are recessed, a first n-type epitaxial layer 131 is formed on the recessed fin structure 52, and a second n-type epitaxial layer 133 is formed on the first n-type epitaxial layer 131 for the n-channel FET, and a first p-type epitaxial layer 135 is formed on the recessed fin structure 52, and a second p-type epitaxial layer 137 is formed on the first n-type epitaxial layer 135 for the p-channel FET. The second n-type epitaxial layer 133 has a diamond cross sectional view dues to a lateral growth of the epitaxial layer, and the second p-type epitaxial layer 137 has a diamond cross sectional view dues to a lateral growth of the epitaxial layer.

The thickness H16 of the first n-type epitaxial layer 131 is in a range from about 0.5 nm to about 3 nm in some embodiments, and the thickness H17 of the second n-type epitaxial layer 133 is in a range from about 2 nm to about 40 nm in some embodiments. The thickness H26 of the first p-type epitaxial layer 135 is in a range from about 0.5 nm to about 3 nm in some embodiments, and the thickness H27 of the second p-type epitaxial layer 137 is in a range from about 2 nm to about 40 nm in some embodiments.

FIGS. 15A-18C show exemplary cross sectional views of various stages for manufacturing a FinFET according to another embodiment of the present disclosure. It is understood that additional operations can be provided before, during, and after processes shown by FIGS. 15A-18C, and some of the operations described below can be replaced or eliminated, for additional embodiments of the method. The order of the operations/processes may be interchangeable. The configurations, structures, materials and/or dimensions same as or similar to those explained with FIGS. 1A-14 may be employed in the following embodiments and the detailed explanation thereof may be omitted. In the following embodiments, a gate-all-around FET is employed.

As shown in FIG. 15A, stacked semiconductor layers are formed over the substrate 50. The stacked semiconductor layers include first semiconductor layers 42 and second semiconductor layers 44. Further, a mask layer 10 is formed over the stacked layers.

The first semiconductor layers 42 and the second semiconductor layers 44 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 42 and the second semiconductor layers 44 are made of Si, a Si compound, SiGe, Ge or a Ge compound. In an embodiment, the first semiconductor layers 42 are $Si_{1-x}Ge_x$, where x is more than about 0.3, or Ge (x=1.0) and the second semiconductor layers 44 are Si or $Si_{1-y}Ge_y$, where y is less than about 0.4, and x>y. In this disclosure, an "M" compound" or an "M based compound" means the majority of the compound is M.

In another embodiment, the second semiconductor layers 44 are $Si_{1-y}Ge_y$, where y is more than about 0.3, or Ge, and the first semiconductor layers 42 are Si or $Si_{1-x}Ge_x$, where x is less than about 0.4, and x<y. In yet other embodiments, the first semiconductor layer 42 is made of $Si_{1-x}Ge_x$, where x is in a range from about 0.3 to about 0.8, and the second semiconductor layer 44 is made of $Si_{1-x}Ge_x$, where x is in a range from about 0.1 to about 0.4.

In FIG. 15A, four layers of the first semiconductor layer 42 and four layers of the second semiconductor layer 44 are disposed. However, the number of the layers are not limited to four, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 42 and the second semiconductor layers 44 are epitaxially formed over the substrate 50. The thickness of the first semiconductor layers 42 may be equal to or greater than that of the second semiconductor layers 44, and is in a range from about 5 nm to about 50 nm in some embodiments, and is in a range from about 10 nm to about 30 nm in other embodiments. The thickness of the second semiconductor layers 44 is in a range from about 5 nm to about 30 nm in some embodiments, and is in a range from about 10 nm to about 20 nm in other embodiments. The thickness of each of the first semiconductor layers 42 may be the same, or may vary.

In some embodiments, the mask layer 10 includes, for example, a pad oxide (e.g., silicon oxide) layer 11 and a silicon nitride mask layer 12, as shown in FIG. 15A.

A mask pattern is further formed over the mask layer. The mask pattern is, for example, a resist pattern formed by lithography operations. By using the mask pattern as an etching mask, a hard mask pattern of the pad oxide layer 11 and the silicon nitride mask layer 12 is formed, as shown in FIG. 15B.

Then, as shown in FIG. 15C, by using the hard mask pattern as an etching mask, the stacked semiconductor layer 42, 44 and the substrate 50 are patterned into fin structures 152 for an n-type FET and fin structures 154 for a p-type FET by trench etching using a dry etching method and/or a wet etching method. The dimensions for the fin structures 152 for an n-type FET may be the same as or different from those for the fin structures 154 for a p-type FET.

After the fin structures 152, 154 are formed, similar to FIG. 1D, a first protective layer 15 is formed to cover the structures 152, 154, as shown in FIG. 15D.

After the first protective layer 15 is formed, similar to FIG. 2A, a second protective layer 17 is formed as shown in FIG. 16A.

Further, similar to FIG. 2B, an isolation insulating layer (STI) 58 is formed in spaces between the fin structures and/or a space between one fin structure and another element formed over the substrate 50, as shown in FIG. 16B.

Similar to FIGS. 2B and 2C, the thick insulating layer 58 is recessed so as to expose the upper portions of the fin structures 152, 154, as shown in FIG. 16C. The height H2' of the fin structures from the upper surface of the isolation insulating layer 58 is in a range from about 20 nm to about 100 nm in some embodiments, and is in a range from about 30 nm to about 50 nm in other embodiments.

Similar to FIG. 2D, after the insulating layer 58 is formed (and recessed), a dummy gate structure including a dummy gate dielectric layer 20 and a dummy gate electrode layer 22 is formed over the fin structures 152, 154, as shown in FIG. 16D.

Figure 17A:
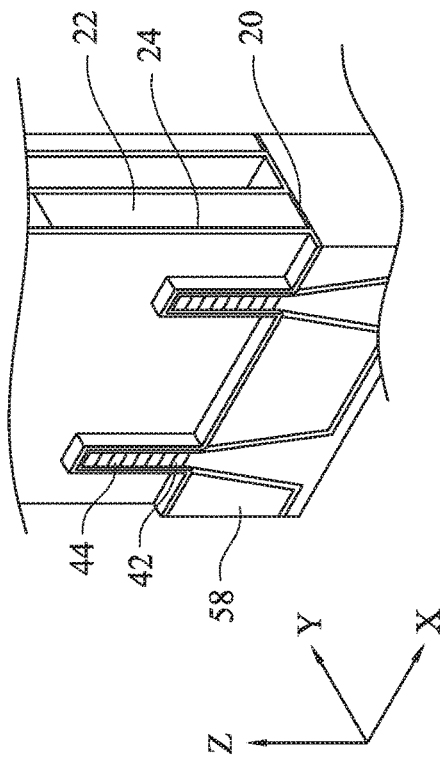
FIGS. 17A-17D show exemplary perspective views of various stages for manufacturing a semiconductor device according to another embodiment of the present disclosure.

Further, similar to FIG. 3C, sidewall spacers 24 are formed on opposite sidewalls of the dummy gate electrode layer 22, as shown in FIG. 17A.

Figure 17B:
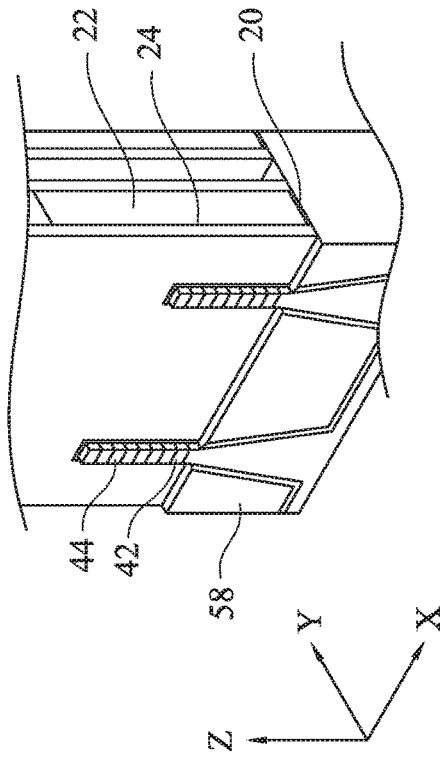

Then, as shown in FIG. 17B, the sidewall spacers 24 formed on the fin structures 152, 154 are removed by using, for example, anisotropic dry etching, so as to expose source/drain regions (stacked semiconductor layer portion) of the structures 152, 154. After the source/drain regions are exposed, the first semiconductor layers 42 are selectively removed by using a wet etchant such as, but not limited to, ammonium hydroxide ($NH_4OH$), tetramethylammonium hydroxide (TMAH), ethylenediamine pyrocatechol (EDP), or potassium hydroxide (KOH) solution. In other embodiments, the second semiconductor layers 44 are selectively removed. In certain embodiments, the first semiconductor layer 42 are removed for n-channel FETs and the second semiconductor layers 44 are removed for p-channel FETs. Yet in other embodiments, the second semiconductor layer 44 are removed for n-channel FETs and the first semiconductor layers 42 are removed for p-channel FETs.

Figure 17C:
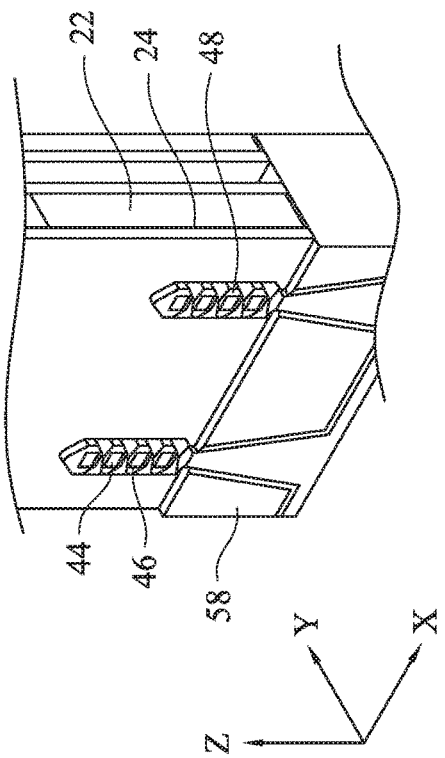

Subsequently, source/drain epitaxial layers 46, 48 are formed, as shown in FIG. 17C. The source/drain epitaxial layer 46 for the n-type FET includes one or more layers of semiconductor material, such as, SiC, SiP and SiCP, which provides appropriate stress to the channel of the n-type FET, in some embodiments. Since the second semiconductor layers 44 are a crystalline semiconductor, the epitaxial layer 46 is also crystalline. The source/drain epitaxial layer 48 for the p-type FET includes one or more of semiconductor material, such as, Ge and $Si_xGe_{1-x}$, where 0<x<1, which provides appropriate stress to the channel of the p-type FET, in some embodiments. Since the second semiconductor layers 44 are a crystalline semiconductor, the epitaxial layer 48 is also crystalline.

The source/drain epitaxial layers 46, 46 may be selectively grown on and around the second semiconductor layers 44 at a temperature of about 600 to 800° C. under a pressure of about 80 to 150 Torr, by using a Si containing gas such as $SiH_4$, $Si_2H_6$ or $SiCl_2H_2$; a Ge containing gas, such as $GeH_4$, $Ge_2H_6$ or $GeCl_2H_2$; a C containing gas, such as $CH_4$ or $C_2H_6$; and/or a dopant gas, such as $PH_3$. The source/drain structure for an n-type FET and the source/drain structure for a p-type FET may be formed by separate epitaxial processes.

Figure 17D:
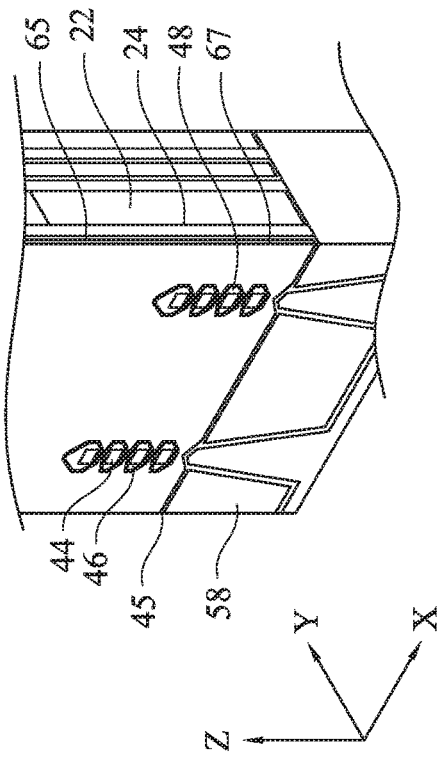

After the source/drain epitaxial layers 46 and 48 are formed, a dielectric cover layer 45 is formed over the source/drain epitaxial layers 46 and 48 and a first interlayer dielectric (ILD) layer 67 is formed over the dielectric cover layer 45, as shown in FIG. 17D. The dielectric cover layer 55 is made of, for example, SiN or SiON, and has a thickness in a range from about 2 nm to about 20 nm in some embodiments. The first ILD 67 is made of a different material than the dielectric cover layer 45 and is made of, for example, one or more layers of silicon oxide, SiCN, SiOCN or a low-k material.

After the first ILD layer 67 is formed, a nano-wire channel structure and a metal gate structure are formed. In certain embodiments, the first ILD layer 67 is formed over the dummy gate structures and a planarization operation, such as a chemical mechanical polishing (CMP) process or an etch-back process, is performed to expose the upper surface of the dummy gate electrode layer 22. The dummy gate structures (the dummy gate electrode layer 22 and the dummy gate dielectric layer 20) are removed by using suitable etching operations, so as to expose stacked structures of the first semiconductor layers 42 and the second semiconductor layers 44. Then, the first semiconductor layers 42 are electively removed, so as to leave the second semiconductor layers 44 as nano-wire channels. A metal gate structure including a gate dielectric layer 72 and a metal gate electrode layer 74 are formed so as to wrap around the second semiconductor layers 44, as shown in FIG. 18A. One or more layers of work function adjustment metal may be formed between the gate dielectric layer 72 and the metal gate electrode layer 74.

In other embodiments, the second semiconductor layers 44 are selectively removed, so as to leave the first semiconductor layers 42 as nano-wire channels. In certain embodiments, the first semiconductor layer 42 are removed for n-channel FETs and the second semiconductor layers 44 are removed for p-channel FETs. Yet in other embodiments, the second semiconductor layer 44 are removed for n-channel FETs and the first semiconductor layers 42 are removed for p-channel FETs.

After the metal gate structure is formed, the first ILD layer 67 and dielectric cover layer 45 are removed. In an embodiment, the first ILD layer 67 and dielectric cover layer 45 are fully removed and in other embodiments, the first ILD layer 67 and dielectric cover layer 45 are partially removed from an area around the source/drain structures.

After the first ILD layer 67 is at least partially removed, similar to FIG. 4B, a metal alloy layer 80, 81 is formed over the source/drain epitaxial layer 46 and 48, as shown in FIG. 18B. The alloy layer 80 is one or more of TiSi, TaSi, NiSi, CoSi, TiSiGe, TaSiGe, NiSiGe and CoSiGe.

After the first ILD layer 67 is removed, transition metal is deposited by, for example, CVD, ALD or PVD, on the source/drain epitaxial layer 46 and 48. During the deposition, the deposited transition metal reacts with Si and/or Ge in the source/drain epitaxial layer 46 and 48, thereby forming the alloy layer 80, 81 in some embodiments.

In the present embodiments, before the alloy layer 80, 81 is formed, the source/drain epitaxial layer 46 formed on one of the second semiconductor layers 44 is separated from the source/drain epitaxial layer 46 formed on the adjacent one of the second semiconductor layers 44 of the first fin structure, and the source/drain epitaxial layer 48 formed on one of the second semiconductor layers 44 is separated from the source/drain epitaxial layer 48 formed on the adjacent one of the second semiconductor layers 44 of the second fin structure. The alloy layer 80, 81 is formed such that the formed alloy layer 80 connects the source/drain epitaxial layer 46 of one of the second semiconductor layers 44 and the source/drain epitaxial layer 46 of the adjacent one of the second semiconductor layers 44, and the alloy layer 81 connects the source/drain epitaxial layer 48 of one of the second semiconductor layers 44 and the source/drain epitaxial layer 62 of the adjacent one of the second semiconductor layers 44.

In some embodiments, after a transition metal layer is formed on the source/drain epitaxial layer 46 and 48, an annealing operation is performed to form the alloy layer 80, 81. The annealing operation is performed at a temperature of about 250° C. to about 850° C.

After the alloy layer 80, 81 is formed, similar to FIG. 4C, a contact-etch stop layer (CESL) 150 is formed to cover the alloy layer 80, 81, and a second ILD layer 160 is formed on the CESL 150, as shown in FIG. 18C. Subsequently, similar to FIG. 4C, a patterning operation is performed to form contact openings over the alloy layer 80, 81 of the source/drain structure, and the openings are filled with a conductive material, thereby forming contact plugs 200 and 201, as shown in FIG. 18C.

After forming the contact plugs, further CMOS processes are performed to form various features such as additional interlayer dielectric layer, contacts/vias, interconnect metal layers, and passivation layers, etc.

In certain embodiments, the operations as explained with FIGS. 5A-6C are employed for a gate-all-around field effect transistor (GAA FET) as explained above.

Figure 19:
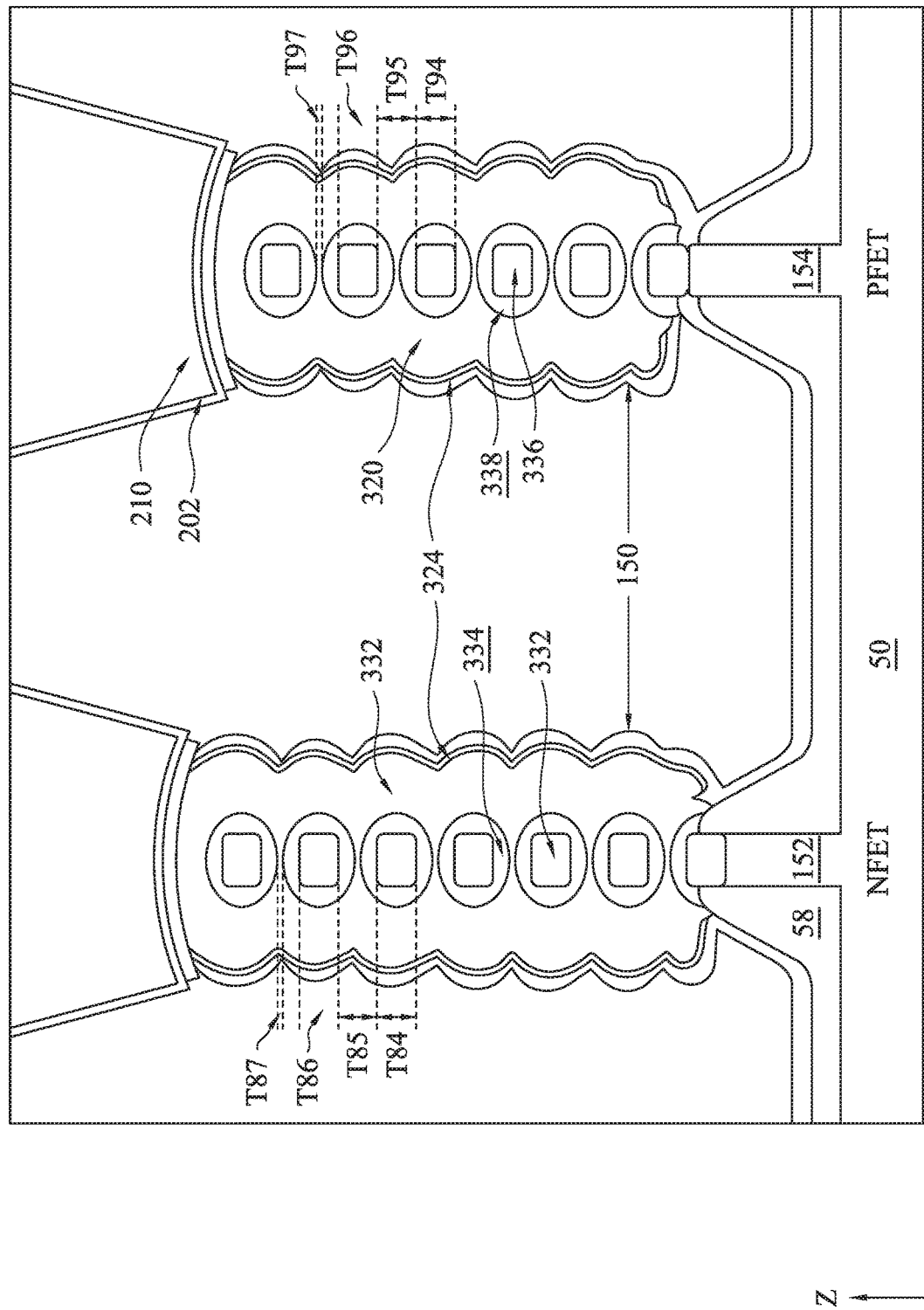
FIG. 19 is an exemplary cross sectional view of source/drain structures of a gate-all-around field effect transistor (GAA FET) according to some embodiments of the present disclosure.

FIG. 19 is an exemplary cross sectional view (X-cut) of source/drain structures of a GAA FET according to some embodiments of the present disclosure. In FIG. 19, an n-channel GAA FET (NFET) and a p-channel GAA FET (PFET) are illustrated as adjacent to each other. However, the configuration is not limited to this. The number of the fin structures may be two or more and one or more additional structures may be disposed between the NFET and the PFET.

In FIG. 19, in the n-channel GAA FET (NFET), n-type semiconductor wire layers 332 (corresponding to, e.g., the second semiconductor layers 44) are disposed over the fin structure 152, and an n-type epitaxial layers 334 (corresponding to, e.g., the source/drain epitaxial layers 46) are formed to wrap around the n-type semiconductor wire layers 332. The n-type semiconductor wire layers 332 and the n-type epitaxial layers 334 are crystalline semiconductor layers, such as Si, SiC, SiCP, SiP, Ge and SiGe, having different lattice constants from each other and from the fin structure. When SiC, SiP and/or SiCP are used, the C or P concentration of the n-type epitaxial layer 334 is higher than that of the n-type semiconductor wire layers 332. In some embodiments, a Group III-V semiconductor layer is used for at least one of the semiconductor wire layers and the n-type epitaxial layers. In certain embodiments, two or more n-type epitaxial layers are formed. Further, the number of n-type semiconductor wire layers 332 is not limited.

Further, the alloy layer 322, for example, a silicide layer, which corresponds to the alloy layer 80, is formed around the n-type epitaxial layer 334. As shown in FIG. 19, one n-type epitaxial layer 334 does not touch the adjacent n-type epitaxial layer 334. The alloy layer 322 fills the space between two n-type epitaxial layers 334 and physically and electrically connects the two n-type epitaxial layers 334.

In some embodiments, a residual transition metal 324, which has not fully reacted with the n-type epitaxial layer 334, remains. In such a case, the remaining transition metal can be converted to a passivation layer by a subsequent nitridation operation by using $NH_3$ or $N_2+H_2$ plasma in some embodiments. The passivation layer covers the surface of the alloy layer 322 to protect the alloy layer 322 from damages caused by the subsequent processes. The contact plug 200 is in contact with the alloy layer 322. In some embodiments, the contact plug 200 includes a barrier layer 202 made of, for example, TiN or TaN, and a body layer 210 made of, for example, Co, W, Ti, Ta, Cu, Ru, Rh, Jr, Al and/or Ni. In some embodiments, spacer residues, which are a remaining part of the sidewall spacers 24 that is not etched in the operation of FIG. 17B, exist.

The thickness T84 of the n-type semiconductor wire layers 332 is in a range from about 5 nm to about 50 nm in some embodiments, and is in a range from about 10 nm to about 30 nm in other embodiments. The space T85 between two adjacent n-type semiconductor wire layers 332 is in a range from about 5 nm to about 50 nm in some embodiments, and is in a range from about 10 nm to about 30 nm in other embodiments. The thickness T86 of the n-type epitaxial layers 334 is in a range from about 1 nm to about 30 nm in some embodiments, and is in a range from about 2 nm to about 7 nm in other embodiments. The space T87 between adjacent n-type epitaxial layers 334 is in a range from about 1 nm to about 10 nm in some embodiments, and is in a range from about 2 nm to about 5 nm in other embodiments.

The p-channel GAA FET (PFET) shown in FIG. 19 has the same or similar structure as the n-channel FET (NFET), and explanations for the common configurations may be omitted. P-type semiconductor wire layers 336 (corresponding to, e.g., the second semiconductor layers 44) are disposed over the fin structure 154, and p-type epitaxial layers 338 (corresponding to, e.g., the source/drain epitaxial layers 48) are formed to wrap around the p-type semiconductor wire layers 336. The semiconductor wire layers and the p-type epitaxial layers are crystalline semiconductor layers, such as Si, SiC, SiCP, SiP, Ge and SiGe, having different lattice constants from each other and from the fin structure. When SiGe is used, the Ge concentration of the second p-type epitaxial layer 338 is higher than that of the semiconductor wire layers 336. In other embodiments, two or more p-type epitaxial layers are formed. Further, the number of p-type semiconductor wire layers 336 is not limited.

Further, the alloy layer 320, for example, a silicide layer, which corresponds to the alloy layer 81, is formed to wrap around the p-type epitaxial layers 338. As shown in FIG. 19, the p-type epitaxial layer 338 formed on one of the adjacent two semiconductor wires 336 does not touch the p-type epitaxial layer 338 of the other one of the adjacent two semiconductor wires 336. The alloy layer 320 fills the space between two p-type epitaxial layers 338 and physically and electrically connects the two p-type epitaxial layers 338.

The thickness T94 of the p-type semiconductor wire layers 336 is in a range from about 5 nm to about 50 nm in some embodiments, and is in a range from about 10 nm to about 30 nm in other embodiments. The space T95 between two adjacent p-type semiconductor wire layers 336 is in a range from about 5 nm to about 50 nm in some embodiments, and is in a range from about 10 nm to about 30 nm in other embodiments. The thickness T96 of the p-type epitaxial layers 338 is in a range from about 1 nm to about 30 nm in some embodiments, and is in a range from about 2 nm to about 7 nm in other embodiments. The space T97 between adjacent p-type epitaxial layers 338 is in a range from about 1 nm to about 10 nm in some embodiments, and is in a range from about 2 nm to about 5 nm in other embodiments.

Figure 20:
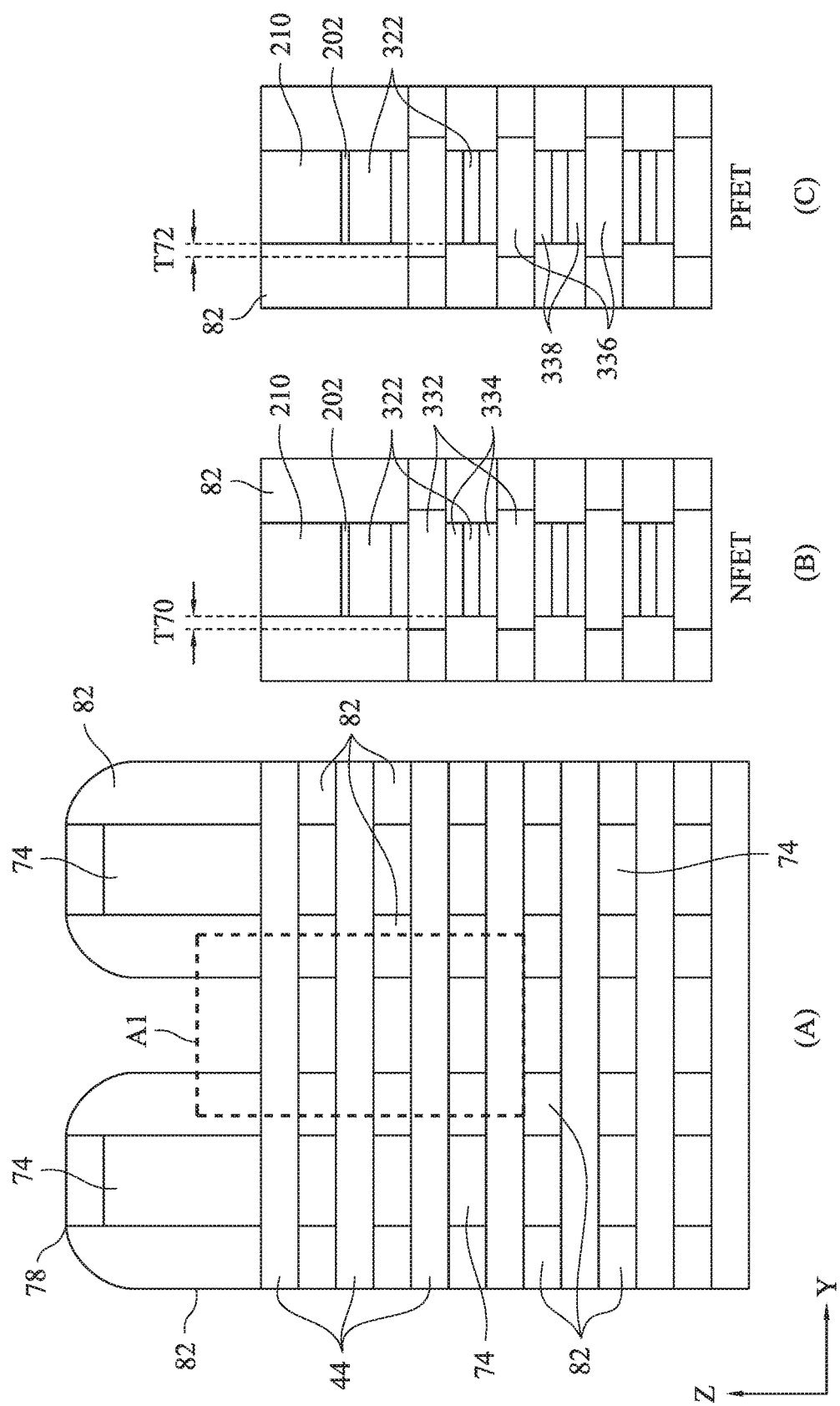
FIG. 20 shows exemplary cross sectional views of source/drain structures of a gate-all-around field effect transistor (GAA FET) according to some embodiments of the present disclosure.

FIG. 20 illustrates exemplary cross sectional views (Y-cut) of source/drain structures of a gate-all-around field effect transistor (GAA FET) according to another embodiment of the present disclosure. (B) and (C) of FIG. 20 correspond to the area A1 of (A) of FIG. 20. In this embodiment, the n-type semiconductor wire layers 332 and p-type semiconductor wire layers 336 are epitaxially formed layers different from the second semiconductor layers 44. For example, the first and second semiconductor layers 42, 44 are fully removed from the source/drain region at the operation of FIG. 17B, and the n-type semiconductor wire layers 332 and p-type semiconductor wire layers 336 are epitaxially formed on the second semiconductor layers 44 extending from the channel region. The n-type semiconductor wire layers 332 and p-type semiconductor wire layers 336 penetrate under the spacer layers 82 in an amount T70 or T72 of about 2 nm to about 10 nm in some embodiments.

FIGS. 21A and 21B are exemplary cross sectional views (Y-cut) of source/drain structures of a gate-all-around field effect transistor (GAA FET) according to another embodiment of the present disclosure. Similar to FIG. 20, the n-type semiconductor wire layers 332 and p-type semiconductor wire layers 336 are epitaxially formed layers different from the second semiconductor layers 44. Unlike FIG. 20, the n-type semiconductor wire layers 332 of one GAA FET are separated from that of adjacent GAA FET, and connected by the n-type epitaxial layers 334. Similarly, the p-type semiconductor wire layers 336 of one GAA FET are separated from that of adjacent GAA FET, and connected by the p-type epitaxial layers 338. In this embodiment, the n-type epitaxial layers 334 are physically separated from each other and are connected by the alloy layer 322, and the p-type epitaxial layers 338 are physically separated from each other and are connected by the alloy layer 320.

In FIG. 21A, the n-type epitaxial layers 334 and the p-type epitaxial layers 338 have the maximum thickness at the middle potion thereof, and in FIG. 21B, the p-type epitaxial layers 338 have the minimum thickness at the middle portion thereof. The maximum thickness is in a range from about 10 nm to about 40 nm and the minimum thickness is in a range from about 0.5 nm to about 5 nm, in some embodiments. The angle TH formed by the n-type or p-type epitaxial layers and the sidewall spacers 84 is in a range from about 30° to 60° in some embodiments. In the structure shown in FIG. 21A, it is possible to increase a contact area. In the structure shown in FIG. 21B, it is possible to provide a larger tensile stress to the channel due to a larger silicide volume.

In the present disclosure, source/drain epitaxial layers are separated but connected by an alloy layer (e.g., silicide layer) and the alloy layer wraps around the epitaxial layers, respectively. With this structure, it is possible to minimize variation of device performance due to misalignment between contact plugs and the source/drain structures.

When two epitaxial layers grown over two adjacent fin structures merges and then metal silicide layer is formed over the merged epitaxial layers, after contact holes for the plugs are formed, metal or metal silicide is formed only within the contact hole and atop the merged S/D epitaxial layers. The total contact area between the metal silicide and epitaxial structure is severely limited or is small. This means that the contact resistance to the source-drain region would be high. In addition, the epitaxially grown source/drain structure conducts current and enables the spreading of the current throughout the fins. However, an epitaxially grown source/drain is not as conductive as a metallic material. When the epitaxial layers are not merged but the space between them is filled with an insulating material, similar problems as set forth above would occur.

In contrast, in the present embodiments, the space between adjacent two source/drain epitaxial layers is fully filled with the metal silicide. Accordingly, it is possible to maximize the total metal silicide/epitaxial layer interfacial contact area via the wrap around silicide scheme so as to reduce overall contact resistance for transistors; and to obtain improved processing margin and improved tolerances for several key manufacturing variations.

It will be understood that not all advantages have been necessarily discussed herein, no particular advantage is required for all embodiments or examples, and other embodiments or examples may offer different advantages.

In accordance with one aspect of the present disclosure, a semiconductor device includes a field effect transistor (FET). The FET includes a first channel, a first source and a first drain; a second channel, a second source and a second drain; and a gate structure disposed over the first and second channels. The gate structure includes a gate dielectric layer and a gate electrode layer. The first source includes a first crystal semiconductor layer and the second source includes a second crystal semiconductor layer. The first source and the second source are connected by an alloy layer made of one or more Group IV element and one or more transition metal elements. The first crystal semiconductor layer is not in direct contact with the second crystal semiconductor layer.

In accordance with another aspect of the present disclosure, a semiconductor device including a fin field effect transistor (Fin FET). The Fin FET includes a substrate; an insulating layer formed on the substrate; a first fin protruding from the substrate, an upper part of the first fin projecting from the insulating layer as a first channel; a first source and a first drain contacting the first channel; a second fin protruding from the substrate, an upper part of the second fin projecting from the insulating layer as a second channel; a second source and a second drain contacting the second channel; and a gate structure disposed over the first and second channels, the gate structure including a gate dielectric layer and a gate electrode layer. The first source includes a first crystal semiconductor layer made of a different material than the first channel. The second source includes a second crystal semiconductor layer made of a different material than the second channel. The first source and the second source are connected by a metal alloy layer. The metal alloy layer is formed by a reaction between a metal and the first source and the second source. The first crystal semiconductor layer is not in direct contact with the second crystal semiconductor layer.

In accordance with another aspect of the present disclosure, in a method of manufacturing a semiconductor device including a field effect transistor (FET), a first FET structure having a first channel, a first source, a first drain and a common gate, and a second FET structure having a second channel, a second source, a second drain and the common gate are formed. An alloy layer is formed on the first and second sources. The first source includes a first crystal semiconductor layer and the second source includes a second crystal semiconductor layer. The first source and the second source are connected by the alloy layer. The alloy layer is made of one or more Group IV element and one or more transition metal elements. The first crystal semiconductor layer is not in direct contact with the second crystal semiconductor layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device including a field effect transistor (FET), the FET comprising:
a first channel, a first source and a first drain;
a second channel, a second source and a second drain; and
a gate structure disposed over the first and second channels, the gate structure including a gate dielectric layer and a gate electrode layer, wherein:
the first source includes a first crystal semiconductor layer and the second source includes a second crystal semiconductor layer,
the first source and the second source are in contact with and connected by an alloy layer made of one or more Group IV element and one or more transition metal elements,
the first crystal semiconductor layer is not in direct contact with the second crystal semiconductor layer, and
the alloy layer fully covers the first and second crystal semiconductor layers.

2. The semiconductor device of claim 1, wherein a space between the first crystal semiconductor layer and the second crystal semiconductor layer is filled with the alloy layer.

3. The semiconductor device of claim 1, wherein the first crystal semiconductor layer is a multi-layer of different crystal semiconductor materials.

4. The semiconductor device of claim 1, wherein:
the FET is a fin FET including a first fin and a second fin protruding from a semiconductor substrate, and
the first crystal semiconductor is a part of the first fin.

5. The semiconductor device of claim 4, wherein the alloy layer directly covers the first crystal semiconductor layer.

6. The semiconductor device of claim 1, wherein:
the FET is a fin FET including a first fin and a second fin protruding from a semiconductor substrate, and
the first crystal semiconductor layer includes one or more layers of different crystal semiconductor materials formed on a part of the first fin.

7. The semiconductor device of claim 6, wherein the alloy layer directly covers the first crystal semiconductor.

8. The semiconductor device of claim 1, wherein the channel is made of Si, $Si_xGe_{1-x}$ where $0<x<1$ or Ge.

9. The semiconductor device of claim 8, wherein the first crystal semiconductor layer includes at least one of Si, SiC, SiC, SiP, SiCP, $Si_xGe_{1-x}$ where $0<x<1$ and Ge.

10. The semiconductor device of claim 9, wherein the alloy layer is one or more of TiSi, TaSi, NiSi, CoSi, TiSiGe, TaSiGe, NiSiGe and CoSiGe.

11. The semiconductor device of claim 1, wherein:
the FET is a fin FET including a first fin and a second fin protruding from a semiconductor substrate and the channel, the source and the drain project from an insulating layer formed on the substrate, and
a void is disposed between a bottom of the alloy layer and an upper surface of the insulating layer.

12. The semiconductor device of claim 11, wherein:
a metal layer is disposed on the upper surface of the insulating layer in the void, and
the metal layer is made of one or more of Ti, Ta, Ni and Co.

13. The semiconductor device of claim 1, wherein the FET further comprises a source contact plug in contact with the alloy layer.

14. A semiconductor device including a fin field effect transistor (Fin FET), the Fin FET comprising:
a substrate;
an insulating layer formed on the substrate;
a first fin protruding from the substrate, an upper part of the first fin projecting from the insulating layer as a first channel;

a first source and a first drain contacting the first channel;
a second fin protruding from the substrate, an upper part of the second fin projecting from the insulating layer as a second channel;
a second source and a second drain contacting the second channel; and
a gate structure disposed over the first and second channels, the gate structure including a gate dielectric layer and a gate electrode layer, wherein:
the first source includes a first crystal semiconductor layer made of a different material than the first channel,
the second source includes a second crystal semiconductor layer made of a different material than the second channel,
the first source and the second source are in contact with and connected by a metal alloy layer,
the metal alloy layer is formed by reaction between a metal and the first source and the second source,
the first crystal semiconductor layer is not in direct contact with the second crystal semiconductor layer, and
the metal alloy layer fully covers the first and second crystal semiconductor layers.

15. The semiconductor device of claim 14, wherein a space between the first crystal semiconductor layer and the second crystal semiconductor layer is filled with the metal alloy layer.

16. The semiconductor device of claim 14, wherein the first and second crystal semiconductor layers are multi layers of different crystal semiconductor materials.

17. The semiconductor device of claim 14, wherein the metal alloy layer directly covers the first and second crystal semiconductor layers.

18. The semiconductor device of claim 14, wherein:
the channel is made of Si, $Si_{1-x}$ where 0<x<1 or Ge,
the first crystal semiconductor layer includes at least one of Si, SiC, SiP, SiCP, $Si_xGe_{1-x}$ where 0<x<1 and Ge.

19. The semiconductor device of claim 18, wherein the metal alloy layer is one or more of TiSi, TaSi, NiSi, CoSi, TiSiGe, TaSiGe, NiSiGe and CoSiGe.

20. A method of manufacturing a semiconductor device including a field effect transistor (FET), the method comprising:
forming a first FET structure having a first channel, a first source, a first drain and a common gate, an a second FET structure having a second channel, a second source, a second drain and the common gate;
forming and alloy layer on the first and second sources, wherein:
the first source includes a first crystal semiconductor layer and the second source includes a second crystal semiconductor layer,
the first source and the second source are in contact with and connected by the alloy layer,
the alloy layer is made of one or more Group IV element and one or more transition metal elements,
the first crystal semiconductor layer is not in direct contact with the second crystal semiconductor layer, and
the alloy layer fully covers the first and second crystal semiconductor layers.

* * * * *